(12) United States Patent
Burgener, II et al.

(10) Patent No.: US 7,473,925 B2
(45) Date of Patent: Jan. 6, 2009

(54) P-TYPE GROUP II-VI SEMICONDUCTOR COMPOUNDS

(75) Inventors: Robert H. Burgener, II, Park City, UT (US); Roger L. Felix, Pleasant Grove, UT (US); Gary M. Renlund, Salt Lake City, UT (US)

(73) Assignee: On International, Inc., Murray, UT (US)

( * ) Notice: Subject to any disclaimer, the term of this patent is extended or adjusted under 35 U.S.C. 154(b) by 0 days.

(21) Appl. No.: 11/620,325

(22) Filed: Jan. 5, 2007

(65) Prior Publication Data

US 2007/0102709 A1    May 10, 2007

Related U.S. Application Data

(63) Continuation of application No. 10/849,345, filed on May 19, 2004, now Pat. No. 7,161,173.

(60) Provisional application No. 60/471,916, filed on May 20, 2003, provisional application No. 60/488,677, filed on Jul. 18, 2003, provisional application No. 60/560,428, filed on Apr. 8, 2004.

(51) Int. Cl.
    *H01L 29/12*    (2006.01)
(52) U.S. Cl. .................... 257/43; 257/102; 257/103
(58) Field of Classification Search .................... 257/43, 257/102, 103, 200, 201
    See application file for complete search history.

(56) References Cited

U.S. PATENT DOCUMENTS 3,664,867 A   5/1972  Galli et al.
3,766,041 A   10/1973 Wasa et al.
3,864,725 A   2/1975  Merrin
4,399,441 A   8/1983  Vaughan et al.

(Continued)

FOREIGN PATENT DOCUMENTS

EP    1215310 A1    6/2002

(Continued)

OTHER PUBLICATIONS

Agne, T., Guan, Z., Li, X.M., Wolf, H., and Wichert, T.; Incorporation of the Donor Indium in Nanocrystalline ZnO; phys. stat. sol.; 2002; pp. 819-823; vol. 229; Wiley-VCH Verlag Berlin GmbH; Berlin.

(Continued)

*Primary Examiner*—Thien F Tran
(74) *Attorney, Agent, or Firm*—Kirton & McConkie; Evan R. Witt

(57) ABSTRACT

A persistent p-type group II-VI semiconductor material is disclosed. The group II-VI semiconductor includes atoms of group II elements, atoms of group VI elements, and one or more p-type dopants. The p-type dopant concentration is sufficient to render the group II-VI semiconductor material in a single crystal form. The semiconductor resistivity is less than about 0.5 ohm·cm, and the carrier mobility is greater than about 0.1 $cm^2/V·s$. Group II elements include zinc, cadmium, the alkaline earth metals such as beryllium, magnesium calcium, strontium, and barium, and mixtures thereof. Group VI elements include oxygen, sulfur, selenium, tellurium, and mixtures thereof. P-type dopants include, but are not limited to, nitrogen, phosphorus, arsenic, antimony, chalcogenides of the foregoing, and mixtures thereof.

20 Claims, 15 Drawing Sheets

U.S. PATENT DOCUMENTS

| | | | |
|---|---|---|---|
| 5,331,655 | A | 7/1994 | Harder et al. |
| 6,057,561 | A | 5/2000 | Kawasaki et al. |
| 6,291,085 | B1 | 9/2001 | White et al. |
| 6,342,313 | B1 | 1/2002 | White et al. |
| 6,410,162 | B1 | 6/2002 | White et al. |
| 6,475,825 | B2 | 11/2002 | White et al. |
| 6,527,858 | B1 | 3/2003 | Yoshida et al. |
| 6,589,362 | B2 | 7/2003 | Haga |
| 6,610,141 | B2 | 8/2003 | White et al. |
| 6,617,183 | B2 | 9/2003 | Kadota et al. |
| 6,624,441 | B2 | 9/2003 | Cantwell et al. |
| 6,664,565 | B1 | 12/2003 | Sano et al. |
| 6,673,478 | B2 | 1/2004 | Kato et al. |
| 6,707,074 | B2 | 3/2004 | Yoshii et al. |
| 6,733,895 | B2 | 5/2004 | Kadota et al. |
| 6,838,308 | B2 | 1/2005 | Haga |
| 6,887,736 | B2 | 5/2005 | Nause et al. |
| 2003/0226499 | A1 | 12/2003 | Teherani |
| 2004/0061114 | A1 | 4/2004 | Yan et al. |
| 2004/0099876 | A1 | 5/2004 | Niki et al. |
| 2004/0108505 | A1 | 6/2004 | Tuller et al. |
| 2004/0175860 | A1 | 9/2004 | Park et al. |

FOREIGN PATENT DOCUMENTS

| | | |
|---|---|---|
| EP | 1219731 A1 | 7/2002 |
| JP | 2002-68890 A1 | 3/2002 |

OTHER PUBLICATIONS

Albertsson, J., and Abrahams, S.C.; Atomic Displacement, Anharmonic Thermal Vibration, Expansivity and Pyroelectric Coefficient Thermal Dependences in ZnO; Acta Cryst.; 1989; pp. 34-40; vol. B45; International Union of Crystallography.

Aoki, T., Shimizu, Y., Miyake, A., Nakamura, A., Nakanishi, Y., and Hatanaka, Y.; p-Type ZnO Layer Formation by Excimer Laser Doping; phys. stat. sol.; 2002; pp. 911-914; vol. 229, No. 2; Wiley-VCh Verlag Berlin GmbH, Berlin.

Arkles, B.; Commercial Applications of Sol-Gel-Derived Hybrid Materials; MRS Bulletin; May 2001 ; pp. 402-407.

Ashrafi, A.B.M.A., Suemune, I., Kumano, H., and Tanaka, S.; Nitrogen-Doped p-Type ZnO Layers Prepared with $H_2O$ Vapor-Assisted Metalorganic Molecular-Beam Epitaxy; Japanese Journal of Applied Physics; 2002; pp. L 1281-L 1284; vol. 41; The Japan Society of Applied Physics.

Bachir, S., Kossanyi, J., and Ronfard-Haret, J.C.; Electroluminescence of $Ho^{3+}$ Ions in a ZnO Varistor-Type Structure; Solid State Communications; 1993; pp. 859-863; vol. 89, No. 10; Elsevier Science Ltd.; Great Britain.

Bachir, S., Kossanyi, J., Sandouly, C., Valat, P., and Ronfard-Haret, J.C.; Electroluminescence of $Dy^{3+}$ and $Sm^{3+}$ Ions in Polycrystalline Semiconducting Zinc Oxide; J. Phys. Chem; 1995; pp. 5674-5679; vol. 99; American Chemical Society.

Balzer, B., Hagemeister, M., Kocher, P., and Ludwig, J.G.; Mechanical Strength and Microstructure of Zinc Oxide Varistor Ceramics; Journal of the American Ceramic Society; 2004; pp. 1932-1938; vol. 87.

Bandyopadhyay, S., Paul, G.K., Roy, R., Sen, S.K., and Sen, S; Study of structural and electrical properties of grain-boundary modified ZnO films prepared by sol-gel technique; Materials Chemistry and Physics; May 17, 2001; pp. 83-91; vol. 74; Elsevier Science B.V.

Baptista, J.L., and Mantas, P.Q.; High Temperature Characterization of Electrical Barriers in ZnO Varistors; Journal of Electroceramics; 2000; pp. 215-224; vol. 4:1; Kluwer Academic Publishers; The Netherlands.

Bockowshi, M.; Growth and Doping of GaN and AlN Single Crystals under High Nitrogen Pressure; Cryst. Res. Technol.; 2001; pp. 771-787; vol. 36; Wiley-VCH Verlag Berlin GmbH, Berlin.

Botha, J.R., Scriven, G.J., Engelbrecth, J.A.A., and Leitch, A.W.R.; Photoluminescence properties of metalorganic vapor phase epitaxial $Zn_3As_2$; Journal of Applied Physics; Nov. 15, 1999; pp. 5614-5618; vol. 86, No. 10; American Institute of Physics.

Brankovic, Z., Brankovic, G., Poleti, D., and Varela, J.A.; Structural and electrical properties of ZnO varistors containing different spinel phases; Ceramics International; 2001; pp. 115-122; vol. 27; Elsevier Science Ltd. And Techna S.r.l.

Brink, D.J., and Engelbrecht, A.A.; Ellipsometric investigation of rough zinc arsenide epilayers; Applied Optics; Apr. 1, 2002; pp. 1894-1898; vol. 41, No. 10; Optical Society of America.

Burden, A.P., Bishop, H.E., Brierley, M., Friday, J.M., Hood, C., et al.; Incorporating consumer-priced field emitting inks into arrays of triode devices; Solid State Electronics; 2001; pp. 987-996; vol. 45; Printable Field Emitters Ltd.

Canney, S.A., Sashin, V.A., Ford, M.J., and Kheifets, A.S.; Electronic band structure of magnesium and magnesium oxide: experiment and theory; J. Phys. Condens. Matter; 1999; pp. 7507-7522; vol. 11; IOP Publishing Ltd.

Chakrabarti, S., Ganguli, D., Chaudhuri, S., and Pal, A.K.; Crystalline magnesium oxide films on soda lime glass by sol-gel processing; Meterials Letters; May 2002; pp. 120-123; vol. 54; Elsevier Science B.V.

Counio, G., Esnouf, S., Gacoin, T., and Boilot, J.-P.; CdS:Mn Nanocrystals in Transparent Xerogel Matrices: Synthesis and Luminescence Properties; J. Phys. Chem.; 1996; pp. 20021-20026; vol. 100; American Chemical Society.

Daneu, N., Reenik, A., and Bernik, S.; Grain Growth Control in $Sb_2O_3$-Doped Zinc Oxide; Journal of the American Ceramic Society; 2003; pp. 1379-1384; vol. 86, No. 8.

Duan, X.L., Yuan, D.R., Cheng, X.F., Sun, H.Q., Sun, Z.H., et al; Microstructure and Properties of $Co^{2+}$: $ZnAl_2O_4/SiO_2$ Nanocomposite Glasses Prepared by Sol-Gel Method; Journal of the American Ceramic Society; 2005; pp. 399-403; vol. 88, No. 2.

Engelbrecht, J.A.A., Scriven, G.J., Neethling, J.H., and Wagener, M.C.; Crack formation in $Zn_3As_2$ epilayers grown by MOVPE; Journal of Crystal Growth; 2000; pp. 235-244; vol. 216; Elsevier Science B.V.

Falcony, C., Ortiz, A., Dominguez, J.M., Farias, M.H., Cota-Araiza, L. et al.; Luminescent Characteristics of Tb Doped $Al_2O_3$ Films Deposited by Spray Pyrolysis; J. Electrochem Soc.; Jan. 1992; pp. 267-271; vol. 139, No. 1; The Electrochemical Society, Inc.

Fons, P., Iwata, K., Niki, S., Yamada, A., and Matsubara, K.; Growth of high-quality epitaxial ZnO films on $\alpha$-$Al_2O_3$; Journal of Crystal Growth; 1999; pp. 627-632; vol. 201/202; Elsevier Science B.V.

Fons, P., Iwata, K., Niki, S., Yamada, A., Matsubara, K., et al.; Uniaxial locked growth of high-quality epitaxial ZnO films on (1 1 2 0)$\alpha$-$Al_2O_3$. Journal of Crystal Growth; 2000; pp. 532-536; vol. 209; Elsevier Science B.V.

Gonzalez, R., Chen, Y., Sebek, R.M., Williams, G.P., Williams, R.T., et al.; Properties of the 800-nm luminescence band in neutron-irradiated magnesium oxide crystals; Physical Review B; Mar. 1, 1991; pp. 5228-5233; vol. 43, No. 7; The American Physical Society.

Guo, X-L., Choi, J-H., Tabata, H., and Kawai, T.; Fabrication and Optoelectronic Properties of a Transparent ZnO Homostructural Light-Emitting Diode; Japanese Journal of Applied Physics; 2001 ; pp. L 177-L 180; vol. 40; The Japan Society of Applied Physics.

Haga, K., Kamidaira, M., Kashiwaba, Y., Sekiguchi, T., Watanabe, H.; ZnO thin films prepared by remote plasma-enhanced CVD method; Journal of Crystal Growth; 2000; pp. 77-80; vol. 214/215; Elsevier Science B.V.

Han, J., Mantas, P.Q., and Senos, A.M.R.; Grain growth in Mn-doped ZnO; Journal of the European Ceramic Society; 2000; 2753-2758; vol. 20.

Han, J., Mantas, P.Q., and Senos, A.M.R.; Grain growth in Mn-doped ZnO; Journal of the European Seramic Society; 2000; pp. 2753-2758; vol. 20; Elsevier Science Ltd.

Hoffman, R.L., Norris, B.J., and Wager, J.F.; ZnO-based transparent thin-film transistors; Applied Physics Letters; Feb. 3, 2003; pp. 733-735; vol. 82, No. 5; American Institute of Physics.

Itani, Kenya, et al., "Low-Dislocation-Density GaAs Wafers Grown by Vertical Gradient Freeze Process, Suitable for Mass Production of Semiconductor Lasers," Hitachi Cable Review No. 20, Aug. 2001, pp. 35-38.

Ji, Z., Yang, C., Liu, K., and Ye, Z.; Fabrication and characterization of p-type ZnO films by pyrolysis of zinc-acetate—ammonia solution; Journal of Crystal Growth; 2003; pp. 239-242; vol. 253; Elsevier Science B.V.

Jin, Y., Zhang, B., Yang, S., Wang, Y., Chen, J., et al.; Room temperature UV emission of $Mg_xZn_{1-x}O$ films; Solid State Communications; 2001; pp. 409-413; vol. 119; Elsevier Science Ltd.

Johnson, P.D.; Some Optical Properties of MgO in the Vacuum Ultraviolet; Physical Review; May 15, 1954; pp. 845-846; vol. 94, No. 4.

Johnson, S.; LEDs—An Overview of the State of the Art in Technology and Application; Light Right 5 Conference, May 27-31, 2002, Nice, France.

Joseph, M., Tabata, H., and Kawai, T.; p-Type Electrical Conduction in ZnO Thin Films by Ga and N Codoping; Japanese Journal of Applied Physics; 1999; pp. L 1205-L 1207; vol. 38; Publication Board, Japanese Journal of Applied Physics.

Katayama-Yoshida, H., Sato, K., and Yamamoto, T.; Materials design for new functional semiconductors by ab initio electronic structure calculation: Prediction vs. experiment; JSAP International; Jul. 2006; pp. 20-27; No. 6.

Kato, H., Sano, M., Miyamoto, K., and Yao, T.; Effect of O/Zn on Flux Ratio on Crystalline Quality of ZnO Films Grown by Plasma-Assisted Molecular Beam Epitaxy; Japanese Journal of Applied Physics; 2003; pp. 2241-2244; vol. 42; The Japan Society of Applied Physics.

Kim, K-K., Kim, H-S., Hwang, D-K., Lim, J-H., and Park, S-J.; Realization of $p$-type ZnO thin films via phosphorus doping and thermal activation of the dopant; Applied Physics Letters; Jul. 7, 2003; pp. 63-65; vol. 83, No. 1; American Institute of Physics.

Kobayashi, A., Sankey, O.F., and Dow, J.D.; Deep energy levels of defects in the wurtzite semiconductors AlN, CdS, CdSe, and ZnO; Physical Review B; Jul. 15, 1983; pp. 946-956; vol. 28, No. 2; The American Physical Society.

Kossanyi, J., Kouyate, D., Pouliquen, J., Ronfard-Haret, J.C., Valat, P., et al.; Photoluminescence of Semiconducting Zinc Oxide Containing Rare Earth Ions as Impurities; Journal of Luminescence; 1990; pp. 17-24; vol. 46; Elsevier Science Publishers B.V. (north-Holland).

Kouyate, D., Ronfard-Haret, J.-C., and Kossanyi, J.; Photo- and electro-luminescence of rare earth-doped semiconducting zinc oxide electrodes: Emission from both the dopant and the support; Journal of Luminescence; 1991; pp. 205-210; vol. 50; Elsevier Science Publishers B.V.

Lee, E-C., Kim, Y.-S., Jin, Y.-G., and Chang, K.J.; First-Principles Study of $p$-Type Doping and Codoping in ZnO; Journal of the Korean Physical Society; Dec. 2001; pp. S23-S26; vol. 39.

Lee, J-M., Kim, K.K., Park, S-J., and Choi, W.K.; Low-resistance and non-alloyed ohmic contacts to plasma treated ZnO; Applied Physics Letters; Jun. 11, 2001; pp. 3842-2844; vol. 78, No. 24; American Institute of Physics.

Limpijumnong, S., Zhang, S.B., Wei, S-H., and Park C.H; Doping by Large-Size-Mismatched Impurities: The Microscopic Origin of Arsenic- or Antimony-Doped ρ-Type Zinc Oxide; Physical Review Letters; Apr. 16, 2004; vol. 92, No. 15; The American Physical Society.

Lin, G-R., and Wang, S-C.; Comparison of High-Resistivity ZnO Films Sputtered on Different Substrates; Japanese Journal of Applied Physics; 2002; pp. L398-L401; vol. 41; The Japan Society of Applied Physics.

Look, D.C., and Claflin, B.; P-type doping and devices based on ZnO; Aug. 2003; Wiley-VCH Verlag GmbH & Co.

Look, D.C., et al. "The Future of ZnO Light Emitters," Phys. Stat. Sol. (2004), pp. 1-10.

Look, D.C., Renlund, G.M., Burgener, II, R.H., and Sizelove, J.R.; As-doped p-type ZnO produced by an evaporation/sputtering process; Applied Physics Letters; Nov. 2004; vol. 85.

Look, D.C., Reynolds, D.C., Litton, C.W., Jones, R.L., Eason, D.B., et al.; Characterization of homoepitaxial p-type ZnO grown by molecular beam epitaxy; Applied Physics Letters; Sep. 2, 2002; pp. 1830-1832; vol. 81, No. 10; American Institute of Physics.

Look, D.C.; Emerging Research Fonts Comments by David C. Look; ISI Essential Science Indicators; Apr. 28, 2005.

Lu, J., Ye, Z., Wang, L., Huang, J., and Zhao, B.; Structural, electrical and optical properties of N-doped ZnO films synthesized by SS-CVD; Materials Science in Semiconductor Processing; 2003; pp. 491-496; vol. 5; Elsevier Science Ltd.

Mantas, P.Q., and Baptista, J.L.; The Barrier Height Formation in ZnO Varistors; Journal of the European Ceramic Society; 195; pp. 605-615; vol. 15; Elsevier Science Limited, Great Britain.

Martin, L.P., and Rosen, M.; Correlation between Surface Area Reduction and Ultrasonic Velocity in Sintered Zinc Oxide Powders; Journal of the American Ceramic Society; 1997; pp. 839-846; vol. 80.

Matsuda, T., Kawabe, M., Iwata, H. and Ohzone, T.; Visible Electroluminescence from MOS Capacitors with Si-Implanted $SiO_2$; IEICE Trans. Electron.; Sep. 11, 2002; pp. 1895-1904; vol. E85-C, No. 11.

Miles, G.C., and West, A.R.; Polymorphism and Thermodynamic Stability of $Zn_7Ab_2O_{12}$; Journal of the American Ceramic Society; 2005; pp. 396-398; vol. 88.

Minami, T., Miyata, T., Shirai, T., and Nakatani, T.; Electroluminescent Oxide Phosphor Thin Films Prepared by a Sol-gel Process; Mat. Res. Soc. Symp. Proc.; 2000; pp. Q4.3.1—Q4.3.6; vol. 621; Materials Research Society.

Minegishi, K., Koiwai, Y., Kikuchi, Y., Yano, K., Kasuga, M., et al.; Growth of p-type Zinc Oxide Films by Chemical Vapor Deposition; Japanese Journal of Applied Physics; 1997; pp. L 1453-L 1455; vol. 36.

Modena, S., Soraru, G.D., Blum, Y., and Raj, R.; Passive Oxidation of an Effluent System: The Case of Polymer-Derived SiCO; Journal of the American Ceramic Society; 2005; pp. 339-345; vol. 88.

Morhain, C., Teisseire, M., Vezian, S., Vigue, F., Raymond, F., et al; Spectroscopy of Excitons, Bound Excitons and Impurities in h-ZnO Epilayers; Sep. 30, 2001; pp. 881-885; vol. 229, No. 2; Wiley VCH; Berlin.

Mukai, T., Morita, D., and Nakamura, S.; High-power UV InGaN/AlGaN double-heterostructure LEDs; Journal of Crystal Growth; 1998; pp. 778-781; vol. 189/190; Elsevier Science B.V.

Murray, C.E., Noyan, I.C., and Mooney, P.M.; Mapping of strain fields about thin film structures using x-ray microdiffraction; Applied Physics Letters; Nov. 17, 2003; pp. 4163-4165; vol. 83, No. 20; American Institute of Physics.

Muth, J.F., Brown, J.D., Johnson, M.A.L., Yu, Z., Kolbas, R.M., et al.; Absorption coefficient and refractive index of GaN, AlN and AlGaN alloys; 1999; MRS Internet J. Nitride Semicond.

Myoung, J-M., Yoon, W-H., Lee, D-H., Yun, I., Bae, S-H., et al.; Effects of Thickness Variation of Properties of ZnO Thin Films Grown by Pulsed Laser Deposition; Japanese Journal of Applied Physics; 2002; pp. 28-31; vol. 41 ; The Japan Society of Applied Physics.

Nakahara, K., Takasu, H., Fons, P., Yamada, A., Iwata, K., et al.; Growth of N-doped and Ga+N-codoped ZnO films by radical source molecular beam epitaxy; Journal of Crystal Growth; 2002; pp. 503-508; vol. 237-239; Elsevier Science B.V.

Nakahara, K., Tanabe, T., Takasu, H., Fons, P., Iwata, K., et al.; Growth of undoped ZnO Films with Improved Electrical Properties by Radical Source Molecular Beam Epitaxy; Japanese Journal of Applied Physics; 2001; pp. 250-254; vol. 40; The Japan Society of Applied Physics.

Narazaki, A., Tanaka, K., Hirao, K., Hashimoto, T., Nasu, H., et al.; IR and XPS Studies on the Surface Structure of Poled $ZnO-TeO_2$ Glasses with Second-Order Nonlinearity; Journal of the American Ceramic Society; 2001; pp. 214-217; vol. 84.

Neethling, J.H., Scriven, G.J., and Krekels, T.; A TEM investigation of $Zn_3As_2$ grown on (001) and (111) InP by MOVPE; Journal of Materials Science; 2001; pp. 3997-4002; vol. 36; Kluwer Academic Publishers.

Nonaka, M., Matsushima, S., Mizuno, M., and Kobayashi, K.; Electronic Structure of Group III Elements Dopes into ZnO by Using Molecular Orbital Calculation; Chemistry Letters 2002; Feb. 20, 2002; pp. 580-581; The Chemical Society of Japan.

Nonaka, M., Matsushima, S., Mizuno, M., and Kobayashi, K.; Electronic Structure of Group III Elements Doped into ZnO by Using Molecular Orbital Calculation; Chemistry Letters; 2002; pp. 580-581; The Chemical Society of Japan.

Nonaka, M., Matsushima, S., Mizuno, M., Kobayashi, K.; Electronic Structure of Group III Elements Doped into ZnO by Using Molecular Orbital Calculation; Chemistry Letters; 2002; pp. 580-581; The Chemical Society of Japan.

Norton, D.P., Heo, Y.W., Ivill, M.P., Ip, K., Pearton, S.J., et al; ZnO: growth, doping and processing; Materialstoday; Jun. 2004; Elsevier Ltd.

Noyan, I.C., Jordan-Sweet, J., Liniger, E.G., and Kaldor, S.K.; Characterization of substrate-thin-film interfaces with x-ray microdiffraction; Applied Physics Letters; Jun. 22, 1998; pp. 3338-3340; vol. 72, No. 25; American Institute of Physics.

Noyan, I.C., Wang, P.-C., Kaldor, S.K., and Jordan-Sweet, J.L.; Deformation field in single-crystal fields semiconductor substrates caused by metallization features; Applied Physics Letters; Apr. 19, 1999; pp. 2352-2354; vol. 74, No. 16; American Institute of Physics.

Ohyama, M.; Sol-Gel Preparation of Transparent and Conductive Aluminum-Doped Zinc Oxide Films with Highly Preferential Crystal Orientation; Journal of the American Ceramic Society; 1998; pp. 1622-1632; vol. 81, No. 6.

Olorunyolemi, T., Birnboim, A., Carmel, Y., Wilson, O.C., Lloyd, I.K.; Thermal Conductivity of Zinc Oxide: From Green to Sintered State; Journal of the American Ceramic Society; 2002; pp. 1249-1253; vol. 85.

Ong, H.C., Dai, J.Y., and Du, G.T.; Studies of electronic structure of ZnO grain boundary and its proximity by using spatially resolved electron energy loss spectroscopy; Applied Physics Letter; Jul. 8, 2002; pp. 277-279; vol. 81, No. 2; American Institute of Physics.

Ong, H.C., Li, A.S.K., and Du, G.T.; Depth profiling of ZnO thin films by cathodoluminescence; Applied Physics Letters; Apr. 30, 2001; pp. 2667-2669; vol. 78, No. 18; American Institute of Physics.

Pandey, R., Jaffe, J.E., and Kunz, A.B., *Ab initio* band-structure calculations for alkaline-earth oxides and sulfides; Physical Review B; Apr. 15, 1991; pp. 9228-9237; vol. 43, No. 11; The American Physical Society.

Park, C.H., Zhang, S.B., and Wei, S-H.; Origin of ρ-type doping difficulty in ZnO: The impurity perspective; Physical Review B; Aug. 5, 2002; pp. 073202-1-073202-3; vol. 66; The American Physical Society.

Pearton, S.J., et al. "Wide Band Gap Ferromagnetic Semiconductors and Oxides," Journal of Applied Physics vol. 93, No. 1, Jan. 1, 2003, pp. 1-13.

Petrik, N.G., Alexandrov, A.B., and Vall, A.I., Interfacial Energy Transfer during Gamma Radiolysis of Water on the Surface of $ZrO_2$ and Some Other Oxides; J. Phys. Chem. B; 2001; pp. 5935-5944; vol. 105; American Chemical Society.

Piprek, J., and Nakamura, S.; nano-Scale Effects in GaN-based Light-Emitting Diodes; 2004.

Piprek, J.; Simulation of GaN-based Light-Emitting Devices; 2004.

Qadri, S.B., Kim, H., Horwitz, J.S., and Chrisey, D.B.; Transparent conducting films of $ZnO-ZrO_2$: Structure and properties; Journal of Applied Physics; Dec. 1, 2000; pp. 6564-6566; vol. 88, No. 11; American Institute of Physics.

Qiu, C., Chen, H., Wong, M., and Kwok, H.S.; Dependence of the Current and Power Efficiencies of Organic Light-Emitting Diode on the Thickness of the Constituent Organic Layers; IEEE Transactions On Electron Devices; Sep. 2001; pp. 2131-2137; vol. 48; IEEE.

Recnik, A., Daneu, N., Walther, T., and Mader, W.; Structure and Chemistry of Basal-Plane Inversion Boundaries in Antimony Oxide-Doped Zinc Oxide; Journal of the American Ceramic Society; 2001; pp. 2357-2668; vol. 84.

Ryu, Y.R., Kim, W.J., and White, H.W.; Fabrication of homostructural ZnO p-n junctions; Journal of Crystal Growth; 2000; pp. 419-422; vol. 219; Elsevier Science B.V.

Schonberger, U., and Aryasetiawan, F.; Bulk and surface electronic structures of MgO; Physical Review B; Sep. 15, 1995; pp. 8788-8793; vol. 52, No. 12; The American Physical Society.

Scriven, G.J., Leitch, A.W.R., Neethling, J.H., Kozyrkov, V.V., and Watters, V.J.; The growth of $Zn_3As_2$ on InP by atmospheric pressure MOVPE; Journal of Crystal Growth; 1997; pp. 813-816; vol. 170; Elsevier Science B.V.

Sekiguchi, T., Haga, K., and Inaba, K.; ZnO films grown under the oxygen-rich condition; Journal of Crystal Growth; 2000; pp. 68-71; vol. 214-215; Elsevier Science B.V.

Sekiguchi, T., Ohashi, N., and Yamane, H.; Cathodoluminscence Study on ZnO and GaN; Solid State Phenomena; 1998; pp. 171-182; vols. 63-64; Scitec Publications; Switzerland.

Senger, R.T., and Bajai, K.K.; Binding energies of excitons in polar quantum well heterostructures; Physical Review B; 2003; pp. 205314-1-205314-9; vol. 68; The American Physical Society.

Sheng, H., Emanetoglu, N.W., Muthukumar, S., Feng, S., and Lu, L.; Nonalloyed Al Ohmic Contacts to $Mg_xZn_{12x}O$; Journal of Electronic Materials; 2002; p. 811; vol. 31, No. 7.

Sheng, H., Emanetoglu, N.W., Muthukumar, S., Yakshinskiy, B.V., Feng, S., et al.; Ta/Au Ohmic Contacts to n_type ZnO; Journal of Electronic Materials; 2003; p. 935; vol. 32, No. 9.

Sohn, K.S., Hwang, D.K., and Myoung, J.M.; Time Integrated/Resolved Photoluminescence of ZnO Films Deposited on Sapphire and GaAs; Japanese Journal of Applied Physics; Dec. 2003; pp. 7376-7378; The Japan Society of Applied Physics.

Springer, J., Poruba, A., Vanecek, M., Fay, S., Feitknecht, L., et al.; Improved optical model for thin film silicon solar cells; Presented at $17^{th}$ European Photovoltaic Solar Energy Conference, Munich 2001.

Stravrev, K., Kynev, K., St. Nikolov, G., and Dyakovitch, V.A.; Semiempirical Assignment of the Electron Transitions in Manganese(II)-Doped II-VI Compounds; J. Phys. Chem. Solids; 1987; pp. 841-844; vol. 48, No. 9; Pergamon Journals Ltd.

Subramanyam, T.K., Naidu, B., and Uthanna, S.; Structure and Optical Properties of dc Reactive Magnetron Sputtered Zinc Oxide Films; Cryst. Res. Technol.; 1999; pp. 981-988; vol. 34.

Sun, X.W.; Optical properties of epitaxially grown zinc oxide films on sapphire by pulsed laser deposition; Journal of Applied Physics; Jul. 1, 1999; pp. 408-411; vol. 86, No. 1; American Institute of Physics.

Talbot, D.; LEDs vs. the Light Bulb; Technology Review; May 2003; pp. 30-36.

Tanaka, A., and Mukae, K.; Evaluation of Single Grain Boundaries in ZnO: Rare-Earth Varistor by Micro-Electrodes; Key Engineering Materials; 1999; pp. 235-240; vols. 157-158; Trans Tech Publications, Switzerland; CSJ Series-Publications of the Ceramic Society of Japan vol. 1, The Ceramic Society of Japan.

Teke, A., Ozgur, U., Dogan, S., Gu, X., Morkoc, H., et al.; Excitonic fine structure and recombination dynamics in single-crystalline ZnO; Physical Review B; 2004; pp. 195207-1-195207-10; vol. 70; The American Physical Society.

The Promise of Solid State Lighting for General Illumination: Light Emitting Diodes (LEDs) and Organic Light Emitting Diodes (OLEDs); 2001; pp. 1-29; Optoelectronics Industry Development Association, Washington, D.C.

Tomlins, G.W., Routbort, J.L., and Mason, T.O.; Oxygen Diffusion in Single-Crystal Zinc Oxide; Journal of the American Ceramic Society; 1998; pp. 869-876; vol. 81.

Tsukazaki, A., Atsushi, T., Ohtomo, A., Onuma, T., Ohtani, M., Makino, T., et al; Repeated temperature modulation epitaxy for p-type doping and light-emitting diode based on ZnO; Nature Materials; Jan. 2005; pp. 42-46; vol. 4; Nature Publishing Group.

Tuller, H.L.; ZnO Grain Boundaries: Electrical Activity and Diffusion; Journal of Electroceramics; 1999; pp. 33-40; vol. 4:S1; Kluwer Academic Publishers; Boston.

Tuzemen, S., Xiong, G., Wilkinson, J., Mischick, B., Ucer, K.B., et al.; Production and properties of p-n junctions in reactively sputtered ZnO; Physica B; 2001; pp. 1197-1200; vol. 308-310; Elsevier Science B.V.

Van De Walle, C.G.; Hydrogen as a Cause of Doping in Zinc Oxide; Physical Review Letters; Jul. 31, 2000; pp. 1012-1015; vol. 85, No. 5; The American Physical Society.

Wang, L.G., and Zunger, A.; Cluster-Doping Approach for Wide-Gap Semiconductors: The Case of ρ-type ZnO; Physical Review Letters; Jun. 27, 2003; pp. 256401-1-256401-4; vol. 90, No. 25; The American Physical Society.

Wang, L.G., and Zunger, A.; Cluster-Doping Approach for Wide-Gap Semiconductors: The Case of ρ-type ZnO; Physical Review Letters; Jun. 27, 2003; pp. 256401-1-256401-4; vol. 90, No. 25; The American Physical Society.

Wang, M., Yang, X., and Wang., F.; Properties of Sensitive Materials Mainly Composed of ZnO; J. Mater. Sci. Technol.; 2000; p. 204; vol. 16, No. 2.

Wang, X., Du, G., Gu., C., Jia, J., Li, X., et al.; Two-step growth of ZnO thin films on diamond/Si low-pressure metal-organic chemical vapour deposition; J. Phys. D: Appl. Phys.; 2002;pp. L74-L76; vol. 35; IOP Publishing Ltd., United Kingdom.

Wang, Y.G., Lau, S.P., Lee, H.W., Yu, S.F., Tay, B.K., et al.; Photoluminescence study of ZnO films prepared by thermal oxidation of Zn metallic films in air; Journal of Applied Physics; Jul. 7, 2003; pp. 354-358; vol. 94, No. 1; American Institute of Physics.

Washington, P.L., Ong, H.C., Dai, J.Y., and Chang, R.P.H.; Determination of the optical constants of zinc oxide thin films by spectroscopic ellipsometry; Applied Physics Letter; Jun. 22, 1998; pp. 3261-3263; vol. 72, No. 25; American Institute of Physics.

Web Page '99 SBIR Phase I . . . Topic 14—Electronic Materials, http://www.-ee.eng.buffalo.edu/faculty/paololin/492/semicon.pdf, "Low-Temperature Hydrothermal Growth of Zno for Seminconductor Substrates," Feb. 26, 2004, 2 pages.

Westin, G., Ekstrand, A., Nygren, M., Osterlund, R., and Merkelbach, P.; Preparation of ZnO-based Varistors y the Sol-Gel Technique; J. Mater. Chem.; 1994; pp. 615-621; vol. 4.

Xiong, G., Wilkinson, J., Mischuck, B., Tu''Zemen, S., Ucer, K.B., et al; Control of p-and n-type conductivity in sputter deposition of undoped ZnO; Applied Physics Letters; Feb. 18, 2002; p. 1195; vol. 80, No. 7.

Xiong, G., Wilkinson, J., Mischuck, B., Tuzemen, S., Ucer, K.B., et al.; Control of ρ-and $n$-type conductivity in sputter deposition of undoped ZnO; Applied Physics Letters; Feb. 18, 2002; pp. 1195-1197; vol. 80, No. 7; American Institute of Physics.

Yamamoto, T., and Katayama-Yoshida, H.; Solution Using a Codoping Method to Unipolarity for the Fabrication of ρ-Type ZnO; Japanese Journal of Applied Physics; Feb. 15, 1999; pp. L 166-L 169; vol. 38; Japanese Journal of Applied Physics Publication Board.

Yamamoto, T., and Katayama-Yoshida, H.; Unipolarity of ZnO with a wide-band gap and its solution using codoping method; Journal of Crystal Growth; 2000; pp. 552-555; vol. 214/215; Elsevier Science B.V.

Yamamoto, T.; Codoping Method to Realize Low-Resistivity ρ-type ZnO Thin Films; Asia Display/IDW '01, Oct. 16-19, 2001, Nagoya, Oct. 18, PH1-2.

Yamasaki, A., and Fujiwara, T.; Electronic structure of the $MO$ oxides ($M$=Mg, Ca, Ti, V) in the GW approximation; Physical Review B; 2002; pp. 245108-1-245108-9; vol. 66; The American Physical Society.

Ye, Z-Z., Lu, J-G., Chen, H-H., Zhang, Y-Z., Wang, L., et al.; Preparation and characteristics of p-type ZnO films by DC reactive magnetron sputtering; Journal of Crystal Growth; 2003; pp. 258-264; vol. 253; Elsevier Science B.V.

Yoshikawa, H., and Adachi, S.; Optical Constants of ZnO; Japanese Journal of Applied Physics; 1997; pp. 6237-6243; vol. 36.

Yu, S.F., Yuen, C., Lau, S.P., Wang, Y.G., Lee, H.W., et al.; Ultraviolet amplified spontaneous emission from zinc oxide ridge waveguides on silicon substrate; Applied Physics Letter; Nov. 24, 2003; pp. 4288-4290; vol. 83, No. 21; American Institute of Physics.

Yuldashev, S.U., Panin, G.N., Choi, S.W., Yalishev, V.S., Nosova, L.A., et al.; Electrical and Optical Properties of ZnO Films Grown on GaAs Substrates; Jpn. J. Appl. Phys; 2003; pp. 3333-3336; vol. 42; The Japan Society of Applied Physics.

Zhang, S.B., Wei, S.H., and Zunger, A.; Intrinsic $n$-type versus ρ-type doping asymmetry and the defect physics of ZnO; Physical Review B; Jan. 31, 2001; pp. 075205-1-075205-7; vol. 63; The American Physical Society.

Zhenguo, J., Kun, L., Chengxing, Y., Ruixin, F., and Zhizhen, Y.; Structural, optical and electrical properties of ZnO thin films prepared by reactive deposition; Journal of Crystal Growth; 2003; pp. 246-251; vol. 253; Elsevier Science B.V.

Zunger, A.; Practical Doping Principles; NCPV and Solar Program Review Meeting 2003; pp. 831-835.

P-TYPE GROUP II-VI SEMICONDUCTOR COMPOUNDS

CROSS-REFERENCE TO RELATED APPLICATIONS

This application is a continuation of U.S. application Ser. No. 10/849,345, filed May 19, 2004, now U.S Pat No. 7,161,173 which application claims the benefit of U.S. Provisional Application No. 60/471,916, filed May 20, 2003, U.S. Provisional Application No. 60/488,677, filed Jul. 18, 2003, and U.S. Provisional Application No. 60/560,428, filed Apr. 8, 2004, which applications are incorporated by reference.

BACKGROUND OF THE INVENTION

The present invention provides p-type group II-VI semiconductor compounds.

As used herein, the group II-VI semiconductor compounds include group II elements selected from zinc, cadmium, the alkaline earth metals such as beryllium, magnesium calcium, strontium, and barium, and mixtures thereof, and group VI elements selected from oxygen, sulfur, selenium, tellurium, and mixtures thereof. The group II-VI semiconductor compounds may be doped with one or more p-type dopant. Such p-type dopants include, but are not limited to, nitrogen, phosphorus, arsenic, antimony, chalcogenides of the foregoing, and mixtures thereof. Zinc oxide and zinc sulfide are two presently preferred group II-VI semiconductor compounds.

Zinc oxide (ZnO) and zinc sulfide are wide band gap semiconductors with potential for use in electrically excited devices such as light emitting devices (LEDs), laser diodes (LDs), field effect transistors (FETs), photodetectors operating in the ultraviolet and at blue wavelengths of the visible spectrum, and other similar devices. Gallium nitride (GaN) is becoming more commonly used as a semiconductor material for the electronic devices mentioned above.

Zinc oxide has several advantages over GaN. For instance, ZnO has a significantly larger exciton binding energy than GaN, which suggests that ZnO-based lasers should have more efficient optical emission and detection. Zinc oxide drift mobility saturates at higher fields and higher values than GaN, potentially leading to higher frequency device performance. Zinc oxide has superior radiation-resistance (2 MeV at $1.2 \times 10^{17}$ electrons/cm$^2$) compared to GaN, which is desirable for radiation hardened electronics. Zinc oxide has high thermal conductivity (0.54 W/cm·K). Zinc oxide has strong two-photon absorption with high damage thresholds, rendering it ideal for optical power limiting devices. Unlike GaN, zinc oxide does not as readily form polytypes or crystal lattice stacking irregularities.

N-type zinc oxide semiconductor materials are known and relatively easy to prepare, such as ZnO doped with aluminum, gallium, or other known n-type dopants. P-type zinc oxide semiconductor materials are theoretically possible, but have been difficult to prepare. D. C. Look et al., "The Future of ZnO Light Emitters," Phys. Stat. Sol., 2004, summarize data on p-type ZnO samples reported in the literature. The best reported ZnO samples have resistivity values of 0.5 ohm·cm (N/Ga dopants) and 0.6 ohm·cm (P dopant). Many of the reported p-type zinc oxide samples tend to be light, heat, oxygen, and moisture sensitive. Some convert to n-type material over time. Their stability has been questioned. No commercially viable p-type zinc oxide semiconductor materials are currently known. Therefore, it would be an advancement in the art to provide commercially viable p-type zinc oxide semiconductor materials. More particularly, it would be an advancement in the art to provide commercially viable p-type group II-VI semiconductor materials.

BRIEF SUMMARY OF THE INVENTION

The present invention is drawn to a persistent p-type group II-VI semiconductor material. The group II-VI semiconductor is a thin film of a single crystal comprising atoms of group II elements, atoms of group VI elements, and one or more p-type dopants. The p-type dopant concentration is sufficient to provide the desired p-type semiconductor property in a single crystal form. Too much dopant may diminish desired electronic properties and inhibit single crystal formation. The semiconductor resistivity is less than about 0.5 ohm·cm, and preferably much lower. The carrier mobility is greater than about 0.1 cm$^2$/V·s, and preferably much greater. A persistent p-type group II-VI semiconductor material may be deposited as a thin film on an amorphous, polycrystalline, or crystalline self supporting substrate surface.

The group II elements include, but are not limited to, zinc, cadmium, alkaline earth metals, and mixtures thereof. The group VI elements include, but are not limited to, oxygen, sulfur, selenium, tellurium, and mixtures thereof. The p-type dopant includes, but is not limited to, phosphorus, arsenic, antimony, and chalcogenides of the foregoing, and mixtures thereof. The p-type dopant concentration is in the range from about $10^{16}$ to about $10^{22}$ atoms/cm$^3$, and more preferably in the range from about $10^{17}$ to $10^{19}$ atoms·cm$^{-3}$.

BRIEF DESCRIPTION OF THE SEVERAL VIEWS OF THE DRAWINGS

A more particular description of the invention briefly described above will be rendered by reference to specific embodiments thereof which are illustrated in the appended drawings. These drawings depict only typical embodiments of the invention and are not therefore to be considered to be limiting of its scope. The invention will be described and explained with additional specificity and detail through the use of the accompanying drawings in which.

DETAILED DESCRIPTION OF THE INVENTION

Figure 1:
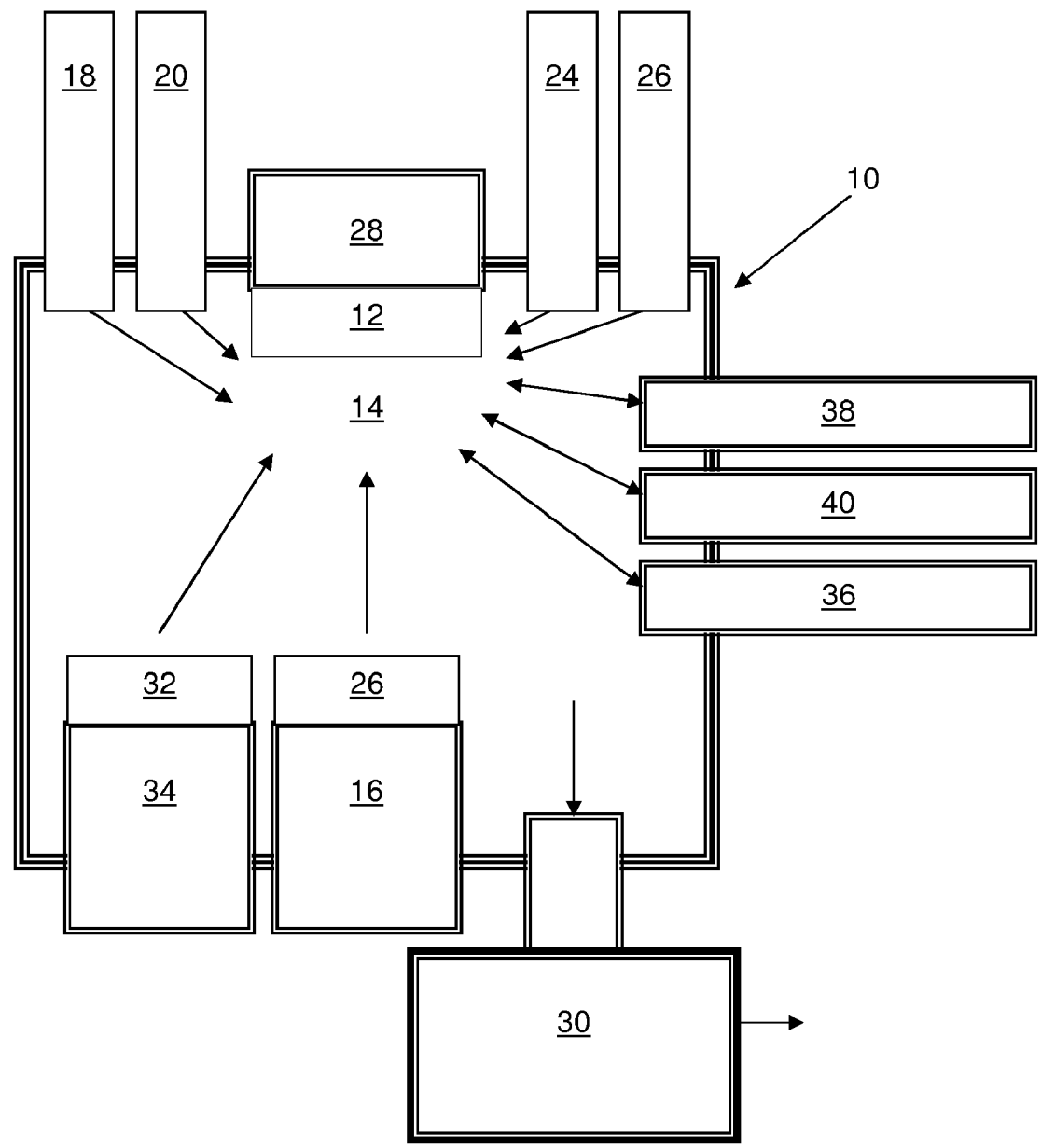
FIG. 1 is a schematic representation of a sputtering system used in the fabrication of certain p-type group II-VI semiconductor materials.

The present invention is drawn to group II-VI semiconductor materials. In particular, the present invention is drawn to group II-VI semiconductor materials that may be fabricated using commercially viable methods. Some fabrication processes, such as molecular beam epitaxy and laser ablation epitaxy, require complicated and expensive equipment to produce small compound samples.

In accordance with one aspect within the scope of the present invention, p-type group II-VI semiconductor materials are fabricated using commercially viable processes in which the partial pressures of the semiconductor constituents are controlled.

In one method within the scope of the present invention, a p-type group II-VI semiconductor material is fabricated by obtaining a self supporting substrate surface and depositing a thin film of group II-VI semiconductor doped with one or more p-type dopants on the substrate surface. The deposition conditions are controlled such that the group II, group VI, and p-type dopant atoms are in a gaseous phase prior to combining as the thin film of group II-VI semiconductor.

The resulting thin film of group II-VI semiconductor is a persistent p-type semiconductor. As used herein a persistent p-type semiconductor is not substantially degraded by UV or visible light exposure, exists at substantially room temperature and pressure, and retains its p-type semiconductor characteristic for an extended period of time, greater than one year. Depending upon the choice of group II-VI elements, the semiconductor material may also exhibit high temperature stability and radiation resistance. This is particularly relevant to zinc oxide semiconductors.

The p-type dopant may be selected from known p-type dopant materials. Typical p-type dopants include, but are not limited to, nitrogen, phosphorus, arsenic, antimony, chalcogenides of the foregoing, and mixtures thereof.

The band gap of the group II-VI semiconductor may be controlled by including additional dopant or alloy compounds including, but not limited to, cadmium oxide and magnesium oxide, which are themselves group II-VI compounds. As an example, zinc oxide host has a band gap of about 3.2 eV. The zinc oxide band gap may be modified using known band gap engineering techniques. By varying the host material, the light emission wavelength may be adjusted. Zinc oxide alloyed with magnesium oxide may increase the band gap to about 4.0 eV which will result in a light emission of about 310 nm. Similarly, cadmium oxide alloyed with zinc oxide, alone or in combination with other cadmium chalcogenides, may decrease the band gap which will result in a light emission in the visible region up to about 660 nm. The amount of magnesium oxide or cadmium oxide will typically range up to about 20 mole % to achieve a desired band gap or other electronic properties.

The p-type dopant concentration in the group II-VI semiconductor is preferably greater than about $10^{16}$ atoms·cm$^{-3}$, and typically in the range from about $10^{16}$ to about $10^{22}$ atoms·cm$^{-3}$. More preferably, the p-type dopant concentration is in the range from about $10^{17}$ to $10^{19}$ atoms·cm$^{-3}$. The dopant content in the resulting group II-VI material may be varied and controlled. High dopant content is possible using techniques within the scope of the present invention.

The semiconductor resistivity is preferably less than about 0.5 ohm·cm. More preferably the resistivity is less than about 0.1 ohm·cm, more preferably the resistivity is less than about 0.01 ohm·cm, and more preferably the resistivity is less than about 0.001 ohm·cm.

The carrier mobility is preferably greater than about 0.1 cm$^2$/V·s. More preferably, the carrier mobility is greater than 0.5 cm$^2$/V·s, and more preferably the carrier mobility is greater than 4 cm$^2$/V·s. Carrier mobilities greater than 100 cm$^2$/V·s have been observed.

The group II-VI semiconductor may be deposited as a thin film on self supporting substrates known in the art such as sapphire and silicon carbide. However, the semiconductor materials need not be deposited on expensive crystal growth substrates. Instead, they may advantageously be deposited on lower cost crystalline, polycrystalline, and amorphous substrates. Such substrates may include, but are not limited to, silicon wafers, amorphous self supporting substrate surfaces like fused silica and glasses such as borosilicate glass and soda lime glass, and polycrystalline substrate surfaces such as alumina. The group II-VI semiconductor materials may be deposited on many other substrates. The choice of substrate may be affected by the desired application of the semiconductor, including transparency, electronic properties, cost, and degree of crystallinity.

The group II-VI semiconductor material is preferably deposited as a single crystal. As used herein, a single crystal group II-VI semiconductor material possesses a single predominant reflection on an X-ray diffraction pattern. Polycrystalline materials will possess multiple reflection peaks on an X-ray diffraction pattern. Persons skilled in the art will appreciate that a perfect single crystal, defect free, does not exist. There will always be some minor crystal defects present. As used herein, a single predominant reflection peak will possess at least 95% of the integrated area of the X-ray diffraction pattern, and more preferably greater than 99%.

Zinc oxide doped with arsenic is one presently preferred group II-VI semiconductor. Several possible fabrication methods may be used to prepare p-type zinc oxide doped with arsenic. For example, in one fabrication method within the scope of the present invention, a thin film of zinc arsenide ($Zn_3As_2$, $ZnAs_2$, or a mixture thereof) is deposited onto a self supporting substrate, such as fused silica or silicon wafer. The zinc arsenide may be deposited by thermal evaporation, sputtering, a combination of thermal evaporation and sputtering, or other known deposition techniques such as MOCVD, CVD, spin coating, etc.

Zinc oxide doped with arsenic may be sputtered onto the substrate at a temperature at which a portion of the arsenic is in the gas phase. Without being bound by theory, it is presently believed that a portion of the arsenic from the zinc arsenide layer evaporates by heating the substrate during the sputtering process such that the sputtering atmosphere contains identifiable partial pressures of arsenic, zinc, and oxygen. The partial pressures may be determined by a mass spectrometer. These gaseous species are present at appropriate ratios such that when they are forced onto the substrate by action of the magnetic field, they form the desired arsenic doped zinc oxide. The partial pressures of the group II-VI semiconductor compounds is preferably controlled during the fabrication process.

Some useful results have been obtained when the thin film of zinc oxide was sputtered in a sputtering atmosphere comprising hydrogen gas. Without being bound by theory, it is possible the hydrogen in the sputtering atmosphere helps limit the oxygen available to oxidize the zinc and arsenic and form undesired oxides. From a review of the Zn—O—As ternary diagram shown in FIGS. 12A and 12B, too much oxygen present may encourage the formation of undesirable ternary compounds, such as $Zn_4O_9As_2$, $Zn_3O_8As_2$, $Zn_3O_6As_2$, and $ZnO_4As_2$. Hence, it is desirable to limit the oxygen partial pressure during the deposition process. Because hydrogen is known to act as an n-type dopant, it is possible that some hydrogen is incorporated into the semiconductor material and may counteract the activity of the p-type dopant. Therefore, other means for controlling the oxygen content in the sputtering atmosphere may be used.

Effective p-type zinc oxide may be prepared in a manner similar to the method described above, except that it is not necessary to first deposit a zinc arsenide layer onto the substrate. The zinc oxide may be directly sputtered onto the substrate under conditions in which gaseous arsenic is available. This may be accomplished through the use of a heated basket containing arsenic, zinc arsenide, or an arsenic compound. It may also be accomplished through the use of gaseous arsenic compounds, such as arsenic ethoxide (As $(OC_2H_5)_3$).

In the RF magnetron sputtering process, a substrate is placed in a low-pressure chamber. The magnetron sputtering head is driven by an RF power source which generates a plasma and ionization of the gas or gases (e.g., argon and selected dopants). For RF sputtering, a high-frequency generator is used generating electromagnetic power in the MHz-Region (typically about 13.56 MHz). Argon ions bombard the target releasing ions from the target which are liberated and accelerated towards the substrate. Additional atoms in the plasma may also be deposited onto the substrate.

The sputtering process conditions may vary. For example, sputtering system may have a target comprising from about 0.99 to about 0.95 mole % zinc oxide and about 0.01 to about 0.05 mole % arsenic. Alternatively, the sputtering system may have a target comprising from about 0.99 to about 0.95 mole % zinc and about 0.01 to about 0.05 mole % arsenic oxide ($As_2O_3$). Similarly, the sputtering system may have a target comprising zinc metal and arsenic metal or a target comprising zinc oxide and arsenic oxide or a target comprising zinc metal or zinc oxide and a source of gaseous arsenic. Other similar variations in the sputtering process conditions are within the level of skill in the art.

The system may operate at a power in the range from about 20 to about 120 watts. Persons skilled in the art will appreciate that the power may be varied to control deposition time and film thickness, as well as the quality of the resulting film.

Good results have been obtained when the inert sputtering gas is present in the sputtering atmosphere at a pressure in the range from about 4 to 20 mtorr. The inert sputtering gas is preferably selected from argon, krypton, xenon, neon, and helium. Argon is a presently preferred inert sputtering gas. Small amounts of oxygen may be included in the sputtering gas, usually at a pressure in the range from about 1 to 4 mtorr. In some embodiments, beneficial results have been obtained when the thin film is annealed at a temperature in the range from about 300 to about 450° C. for a time period in the range from about 1 to about 15 minutes.

It will be appreciated that alternative p-type dopants may be used in the foregoing methods. For example, antimony has been used to prepare p-type zinc oxide by using antimony or antimony oxide ($Sb_2O_3$) instead of arsenic or arsenic oxide in several of the foregoing sputtering methods. Similarly, the methods may be adapted for use with other group II elements besides zinc, such as cadmium and alkaline earth metals. Likewise, the methods may be adapted for use with other group VI elements besides oxygen, such as sulfur, selenium, tellurium, and mixtures thereof.

There are many potential applications and uses of the p-type group II-VI semiconductor materials, and in particular zinc oxide and zinc sulfide semiconductor materials. For example, it may be combined with a suitable n-type semiconductor material to form a p-n junction used in various electrical components. The n-type semiconductor is preferably compatible with the p-type group II-VI semiconductor and preferably contains an n-type dopant selected from known dopant materials. Typical n-type dopants include, but are not limited to, ions of Al, Ga, B, H, Yb and other rare earth elements, Y, Sc, and mixtures thereof. It may be used to prepare light emitting devices that produce light ranging from the ultraviolet to the red region under an electric potential. Band gap engineering principles can be used to control the light emitted. Ultraviolet light can be used to photopump phosphors and produce visible white light. The low activation energy would permit the light emitting devices to operate at low voltage. The p-type group II-VI semiconductor materials may be used to prepare ultraviolet laser diodes. Just as the thin film may be configured to generate light under an electric potential, the devices may be used as a photovoltaic solar cell to generate electricity when exposed to light or a photodetector device.

The electrical conductivity of the thin films renders them useful in flat-panel display devices. The zinc oxide thin films may be used in electrochromic devices, such as automatically dimming rear-view mirrors for automobiles and electrically controlled "smart" windows. Electric current may be passed through the thin films coated on vehicle windows and freezer display cases to render them frost-free. The thin film conductivity may be exploited to dissipate static electricity from windows on photocopy machines, to form transparent electromagnetic shields, invisible security circuits on windows, and transparent radio antennas built into automobile windows. The high thermal and chemical stability of zinc oxide may render radiation hardened electrical components.

While some of the discussion herein mentions zinc oxide specifically, it will be appreciated that the processes, compositions, and applications thereof, have broad application to group II-VI semiconductors and are not limited solely to zinc oxide.

EXAMPLES

The following examples are given to illustrate various embodiments within the scope of the present invention. These are given by way of example only, and it is to be understood that the following examples are not comprehensive or exhaustive of the many embodiments within the scope of the present invention.

Many of the following Examples involve sputtering. FIG. 1 illustrates a schematic representation of a sputtering system 10 used in some of the following examples. In RF sputtering, a substrate 12 is placed in a low-pressure chamber 14. The magnetron sputtering head 16 is driven by an RF power source (not shown) which generates a plasma and ionization of the sputtering gas or gases between the electrodes. The sputtering gas typically includes an inert sputtering gas, which may include, but is not limited to, argon, krypton, xenon, neon, and helium. The sputtering gas may optionally include one or more selected dopants. A plurality of gas sources 18, 20, 22, and 24 may provide $N_2$, $H_2$, Ar, $O_2$, or other desired gases. For RF sputtering, a high-frequency generator is used generating electromagnetic power in the MHz-Region. Argon ions bombard the target 26, releasing ions from the target which are accelerated towards the substrate. Additional atoms in the plasma may also be deposited onto the substrate, such as dopant atoms.

In the sputtering system of FIG. 1, the substrate 12 is secured in place by a heated substrate fixture 28. The temperature of the heated substrate fixture 28 was measured and reported as the substrate temperature. The sputtering chamber 14 is constantly evacuated with a vacuum pump system 30. The sputtering atmosphere includes an inert sputtering gas mentioned above, and may optionally include other gases which are provided by the respective gas source 18, 20, 22, and 24. The gas pressures reported below, such as 10 mtorr, represent the gas pressure of the respective gas as it is introduced into the sputtering chamber 14. In some embodiments, volatile materials 32, such as arsenic for example, are evaporated in a heated basket, illustrated as the heated evaporator 34. The system includes online pressure measurement 36. It also includes thickness measurement capability 38. The system optionally includes an online mass spectrometer 40 which may measure the gas content and accurately determine the partial pressure of the sputtering atmosphere.

Unless specifically noted, the following are common conditions for the sputtering described in the Examples:

1. The distance between the sputtering target and the deposition substrate was about 1.5 inches.

2. Radio Frequency was 13.56 MHz. It will be appreciated by those skilled in the art that much lower and much higher frequencies may be used in RF sputtering systems. However, for practical considerations and FCC regulations, the radio frequency used was 13.56 MHz.

3. The atmosphere was maintained by using a continuous vacuum, and pressures were controlled by addition of indicated gases. Some residual atmospheric oxygen or moisture adsorbs on the metal surfaces within the sputtering chamber. Therefore, oxygen out-gases during the sputtering process at the operating temperature and pressure.

4. The sputtering time was typically about 10 minutes, but some samples were sputtered for longer time periods, such as an hour, and some samples were sputtered for shorter periods, such as one minute. The sputtering time was selected to produce a film thickness of about one micron. It will be appreciated that several factors affect the film thickness, including, but not limited to, sputtering time, power, temperature, concentration of dopants, and evaporation of constituents of the sputtered thin film.

5. One inch RF magnetron sputtering head was used with water cooling.

6. All samples were tested for semiconductor type by Seebeck and Hall measurement.

7. All chemicals were high purity from Alfa Aesar.

8. In most cases, the operating condition ranges and experimental result ranges are drawn from multiple experiments. Thus, the reported examples and results may represent a composite of several actual experiments.

Example 1

Sputtering of ZnO with Arsenic as a Dopant

A thin film of p-type zinc oxide was deposited onto a self supporting substrate by RF sputtering. Both fused silica and silicon wafers were used as the self supporting substrate. The sputtering target composition was ZnO (0.99–0.95 moles)+ As (0.01–0.05 moles). The preferred target composition was ZnO (0.98 moles)+As (0.02 moles). The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr and $O_2$ at a gas pressure of about 1 to 4 mtorr. The preferred sputtering atmosphere pressures were about 9 mtorr argon and about 1 mtorr $O_2$.

The resulting transparent p-type zinc oxide layer had a resistance of about 10,000 ohms/square. After annealing at 440° C. in air, the resistance dropped to about 1,000 ohms/square. In another composition prepared in accordance with the procedure of this Example, the transparent p-type zinc oxide layer had a resistance ranging from 200,000 ohms/square to 10,000,000 ohms/square. This composition was not subsequently annealed.

Example 2

Sputtering of ZnO with Arsenic as a Dopant

A thin film of p-type zinc oxide was deposited onto a self supporting substrate by RF sputtering. Both fused silica and silicon wafers were used as the self supporting substrate. The sputtering target composition was ZnO (0.99–0.95 moles)+ As (0.01–0.05 moles). The preferred target composition was ZnO (0.98 moles)+As (0.02 moles). The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr and $H_2$ at a gas pressure of about 1 to 4 mtorr. The preferred sputtering atmosphere pressures were about 9 mtorr argon and about 1 mtorr $H_2$.

The resulting transparent p-type zinc oxide layer had a resistance of about 500 ohms/square. Without being bound by theory, it is believed that the hydrogen gas may be moderating the concentration of oxygen in the sputtering atmosphere.

Example 3

Sputtering of ZnO with Arsenic as a Dopant

A thin film of p-type zinc oxide was deposited onto a self supporting substrate by RF sputtering. Both fused silica and silicon wafers were used as the self supporting substrate. The sputtering target composition was ZnO (0.99–0.95 moles)+ As (0.01–0.05 moles). The preferred target composition was ZnO (0.975 moles)+As (0.025 moles). The substrate temperature was between 350 and 550° C. The preferred temperature was about 400° C. The RF power was between 20 and 120 watts. The preferred power was about 60 to 90 watts. The sputtering atmosphere included argon at a gas pressure of about 4 to 20 mtorr. The preferred sputtering atmosphere pressure was about 9 mtorr argon.

Figure 2:
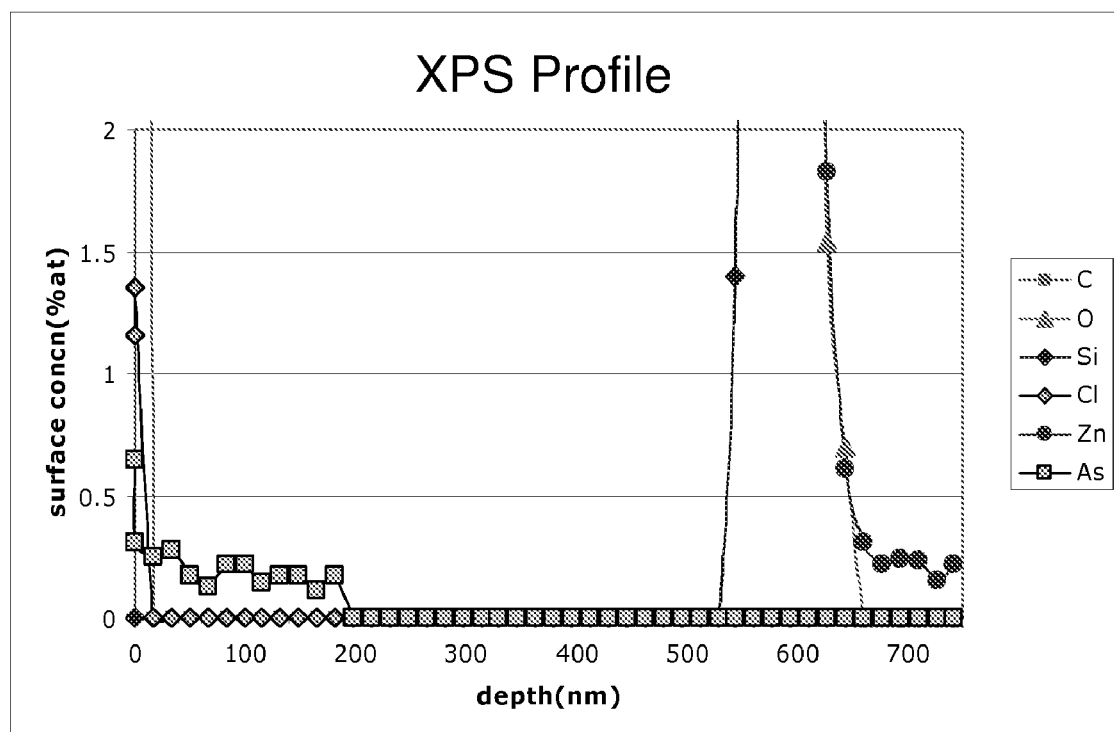
FIG. 2 is a graph X-ray Photoelectron Spectroscopy (XPS) of arsenic doped p-type zinc oxide.

The resulting transparent p-type zinc oxide layer had a resistance of about 1000 ohms/square. The resulting p-type zinc oxide was analyzed by X-ray Photoelectron Spectroscopy (XPS). A graph of the XPS data is shown in FIG. 2. The data from FIG. 2 show arsenic in zinc oxide with a concentration of about 0.25 mole percent.

Example 4

Sputtering of ZnO with Arsenic as a Dopant

A thin film of p-type zinc oxide was deposited onto a self supporting substrate by RF sputtering. Both fused silica and silicon wafers were used as the self supporting substrate. A First Composition Layer comprising zinc and arsenic was deposited onto the self supporting substrate.

In one example, the First Composition Layer was deposited by thermal evaporation of zinc arsenide ($Zn_3As_2$ or $ZnAs_2$) for a period of about 2-60 seconds, with a preferred period of about 14 seconds. The substrate temperature was about 360° C. Thermal evaporation is a well known technique for depositing thin films, particularly metal and metal alloys. Subsequent analysis of the First Composition Layer indicated that it contained zinc and arsenic in approximately equal atomic amounts. This suggests that the stoichiometry of the zinc arsenide had changed during thermal evaporation or that it contained a mixture of zinc arsenide molecules.

The following sequential basic steps take place: (i) a vapor is generated by boiling or subliming a source material, (ii) the vapor is transported from the source to the substrate, and (iii) the vapor is condensed to a solid film on the substrate surface. In the evaporative deposition process, a substrate is placed in a low-pressure chamber. A tungsten crucible is disposed below the substrate. The desired source material or mixture of source materials is placed in the crucible and heated to a temperature sufficiently high to evaporate the source material. The source material vapor condenses on the substrate, which may or may not be heated. Heating the substrate may enhance the bond between the deposited source material film and the substrate. The evaporative deposition process may be completed in less than a minute, and usually a few seconds.

In another example, the First Composition Layer was deposited by RF sputtering. In yet another example, the First Composition Layer was deposited by the combination of thermal evaporation and RF sputtering. It will be appreciated that the First Composition Layer may be deposited using other known, conventional, or novel deposition techniques, including, but not limited to, RF sputtering and evaporative deposition techniques described above, as well as chemical vapor deposition (CVD), metal organic chemical vapor deposition (MOCVD), other evaporation and sputtering techniques, and combinations of these and other thin film deposition technologies.

Preparing a thin film by evaporation alone is a very quick process that is completed in a matter of seconds, but it is difficult to properly control the resulting thin film. In contrast, sputtering alone is a slow process that requires many minutes to complete. The combination of sputtering and thermal evaporation includes heat to facilitate evaporation of the source material and a RF field to induce sputtering. Alternatively, the RF field can be used to heat the source material disposed close to the RF magnetron head sufficiently to evaporate the source material for deposition by thermal evaporation. In this case, a small amount of sputtering will also occur. The resulting thin film is of good quality and quickly prepared. In this case, the combination of sputtering and evaporation was used to deposit $Zn_3As_2$ onto a fused silica substrate at 350° C. for about 50 seconds.

A Second Composition Layer comprising zinc oxide was deposited onto the First Composition Layer by RF sputtering. The sputtering target composition was ZnO. The substrate temperature was between 400 and 550° C. The preferred temperature was about 450° C. The RF power was between 20 and 120 watts. The preferred power was about 100 watts. The sputtering time was between 10 and 40 minutes, and preferably about 20 minutes. The sputtering atmosphere included argon at a gas pressure of about 4 to 20 mtorr. The preferred sputtering atmosphere pressure was about 10 mtorr argon.

The resulting p-type zinc oxide layer had a resistance of about 2,000 to 50,000 ohms/square and a resistivity of about 1.4 ohm·cm. The variable resistance may be attributed to variable thickness of the p-type zinc oxide layer. The concentration of arsenic was about $1.74 \times 10^{18}$ per $cm^3$ and was measured by the Hall effect technique. Without being bound by theory, it is believed that a quantity of arsenic may be evaporated during the sputtering step and become part of the sputtering plasma such that ZnO doped with arsenic was deposited onto substrate.

Figure 3:
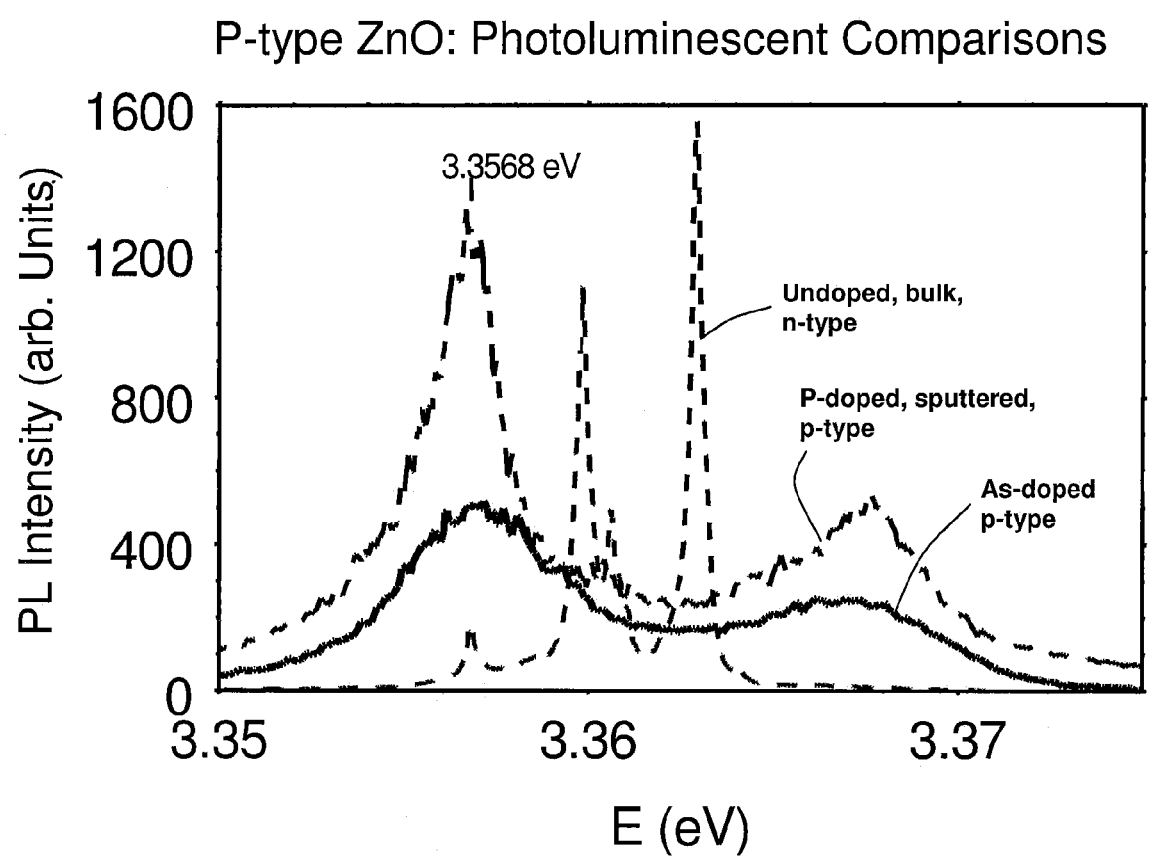
FIG. 3 is a graph of photoluminescence spectra comparing undoped, bulk, n-type zinc oxide with phosphorous doped and arsenic doped p-type zinc oxide.

The photoluminescence of arsenic doped p-type zinc oxide was measured and compared against undoped, bulk, n-type zinc oxide and phosphorus doped p-type zinc oxide. This comparison is shown in FIG. 3. The distinctly different photoluminescence between n-type and p-type zinc oxide is apparent. Moreover, the arsenic doped zinc oxide shows photoluminescence consistent with the phosphorus doped zinc oxide. A noticeable luminescent peak at about 3.3568 eV was observed with both phosphorus doped and arsenic doped p-type zinc oxide.

Figure 4:
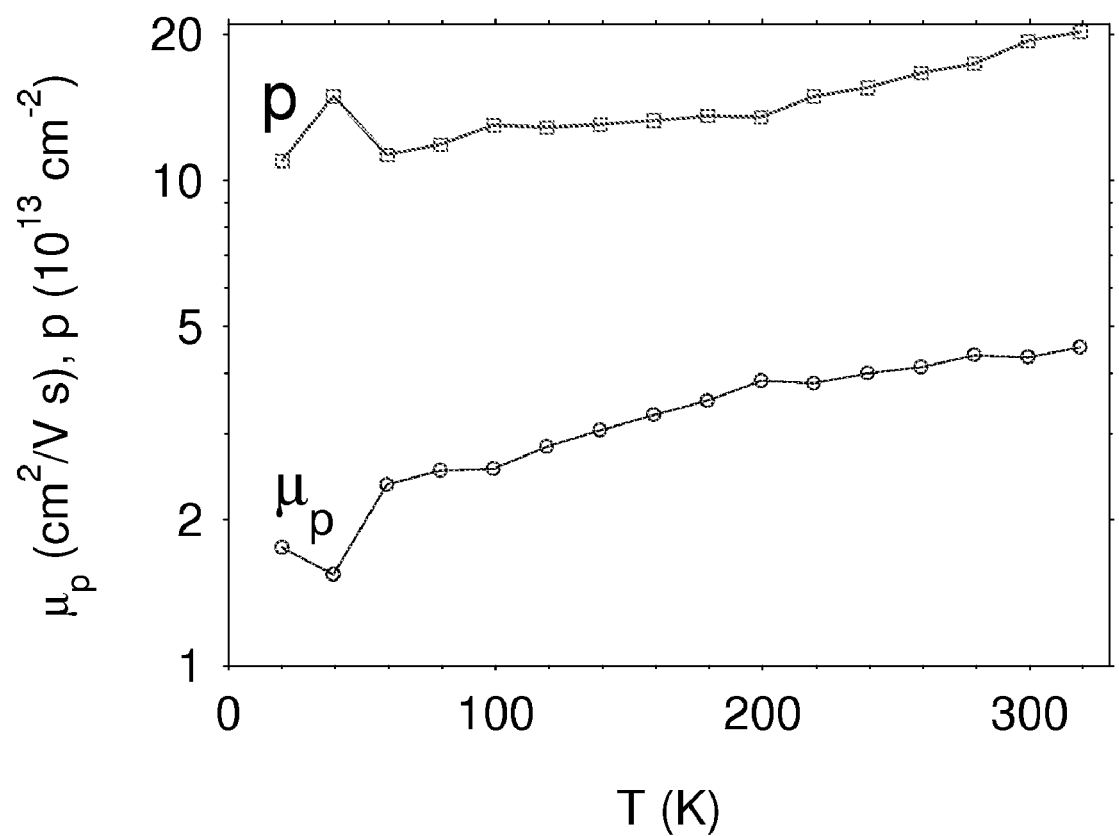
FIG. 4 is a graph of the Hall measurements showing sheet resistance and carrier mobility vs. temperature for arsenic doped p-type zinc oxide.
Figure 5:
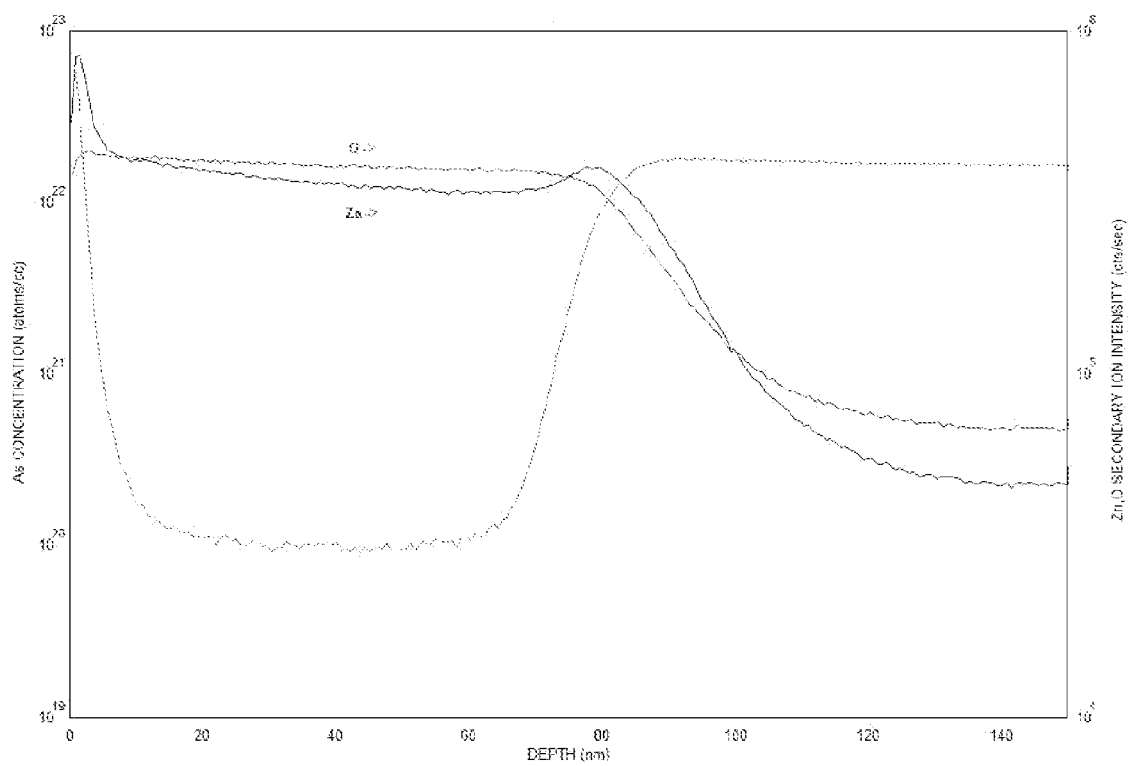
FIG. 5 is a Secondary Ion Mass Spectroscopy (SIMS) graph of an arsenic doped ZnO film measured against a calibrated standard.

The resistance and mobility of the p-type zinc oxide were measured and are shown graphically in FIG. 4. The slope of the mobility curve provides an indication of how deep the centers are located. A sample of the arsenic doped p-type zinc oxide film was analyzed by Secondary Ion Mass Spectroscopy (SIMS) and measured against a calibrated standard. The results, shown graphically in FIG. 5, indicate stable and consistent arsenic doping at a concentration of about $10^{20}$ atoms/$cm^3$ to a depth of about 60 nm. Based upon the SIMS data, the composition of the arsenic doped p-type zinc oxide is labeled on the Zn—O—As ternary diagram of FIG. 12A. Another p-type zinc oxide sample prepared according to the procedure of this Example. It had a composition of $Zn_{0.41}O_{0.59}As_{9.43 \times 10^{-4}}$. It had an arsenic content of about $4.3 \times 10^{19}$ arsenic atoms/$cm^3$ to a depth of about 450 nm.

Figure 12A:
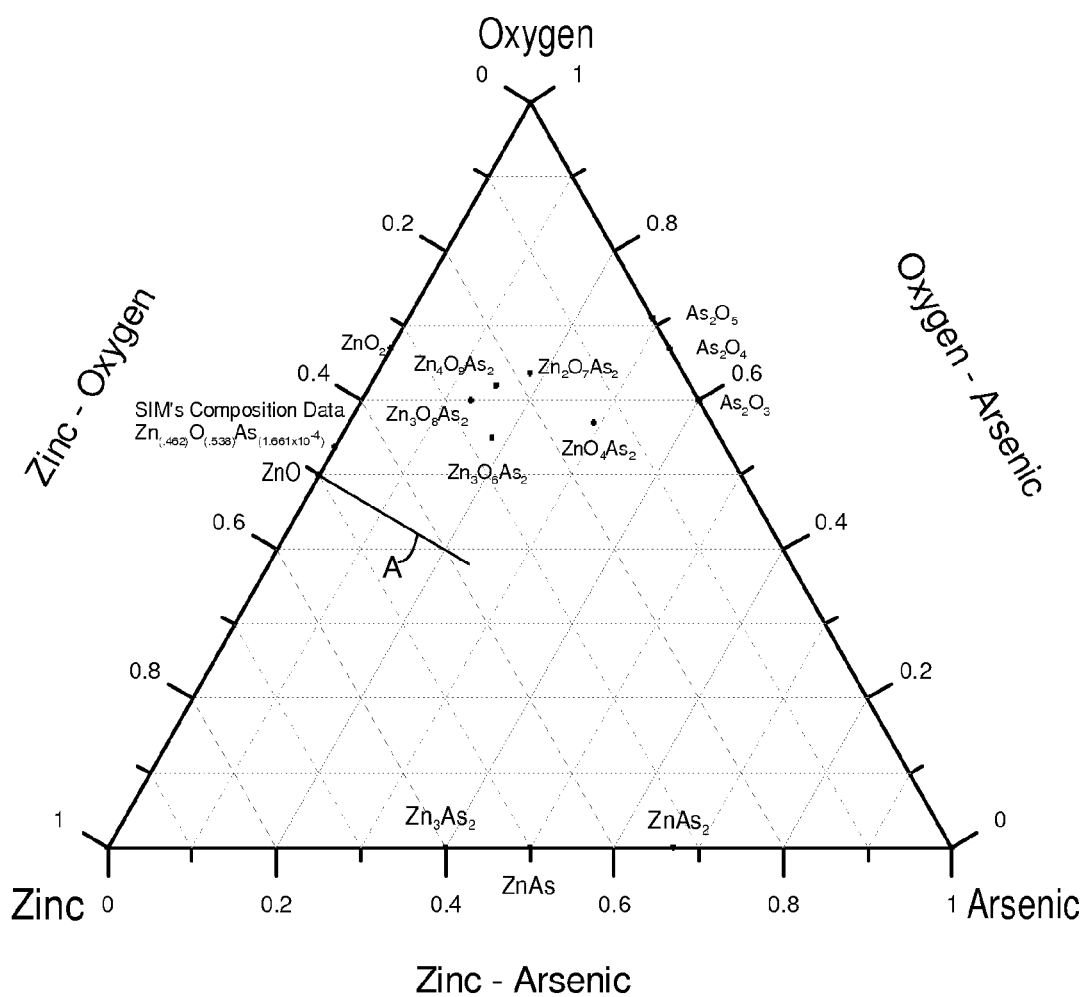
FIGS. 12A and 12B are a zinc—oxygen—arsenic ternary diagram.
Figure 12B:
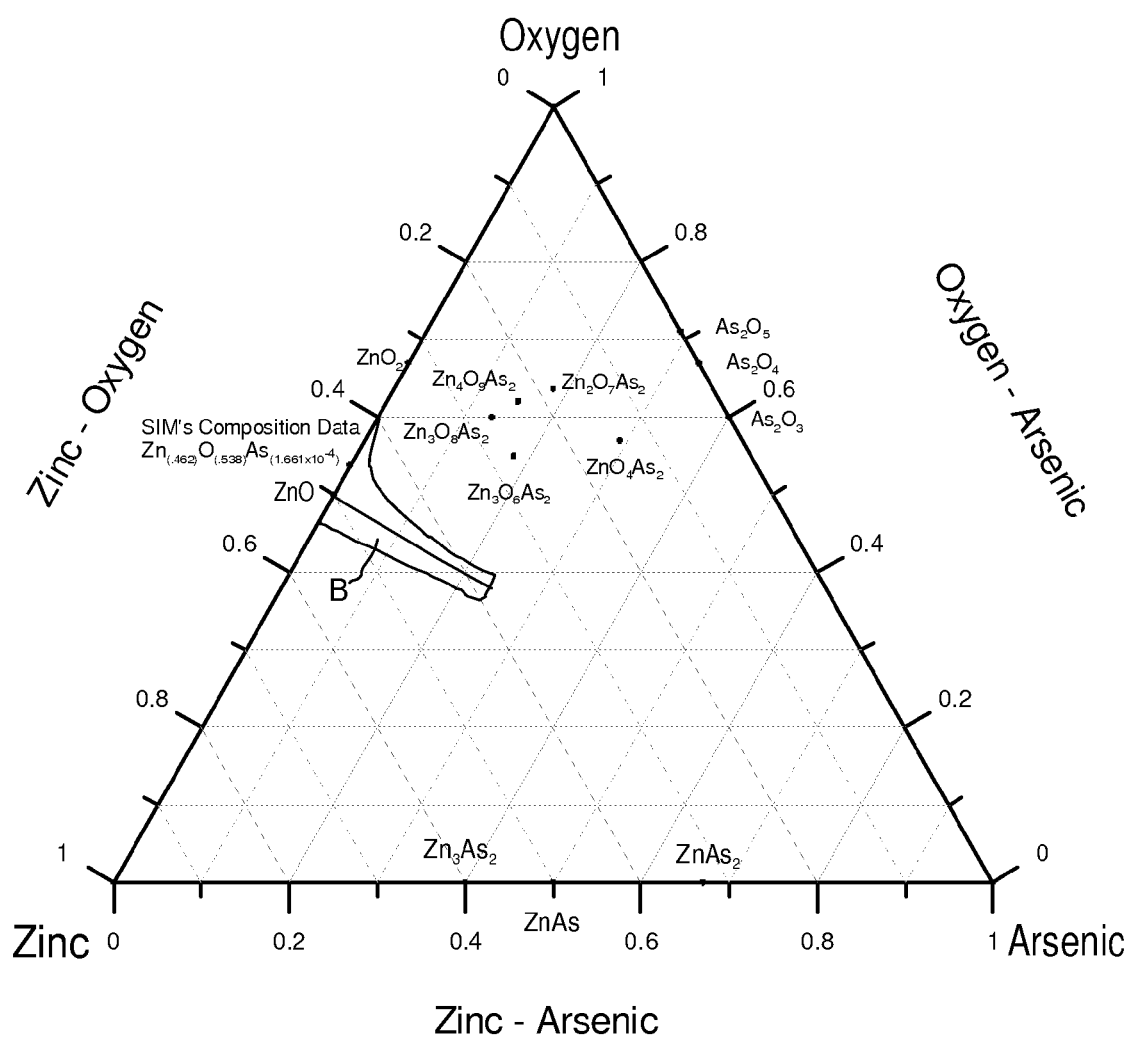

It is noteworthy that the measured compounds do not lie on the stoichiometric arsenic doped ZnO line "A" drawn on FIG. 12A. Line "A" represents stoichiometric arsenic doped zinc oxide up to an arsenic content of about $10^{22}$ atoms/$cm^3$. Because the measured p-type zinc oxide compounds are non-stoichiometric ZnO compounds, it is expected that other non-stoichiometric ZnO compounds having compositions close to line "A" may be prepared. FIG. 12B shows the same ternary diagram as FIG. 12A, except that a region "B" is sketched around Line "A", which represents non-stoichiometric arsenic doped ZnO compounds believed to be potentially useful p-type semiconductor materials.

Figure 13:
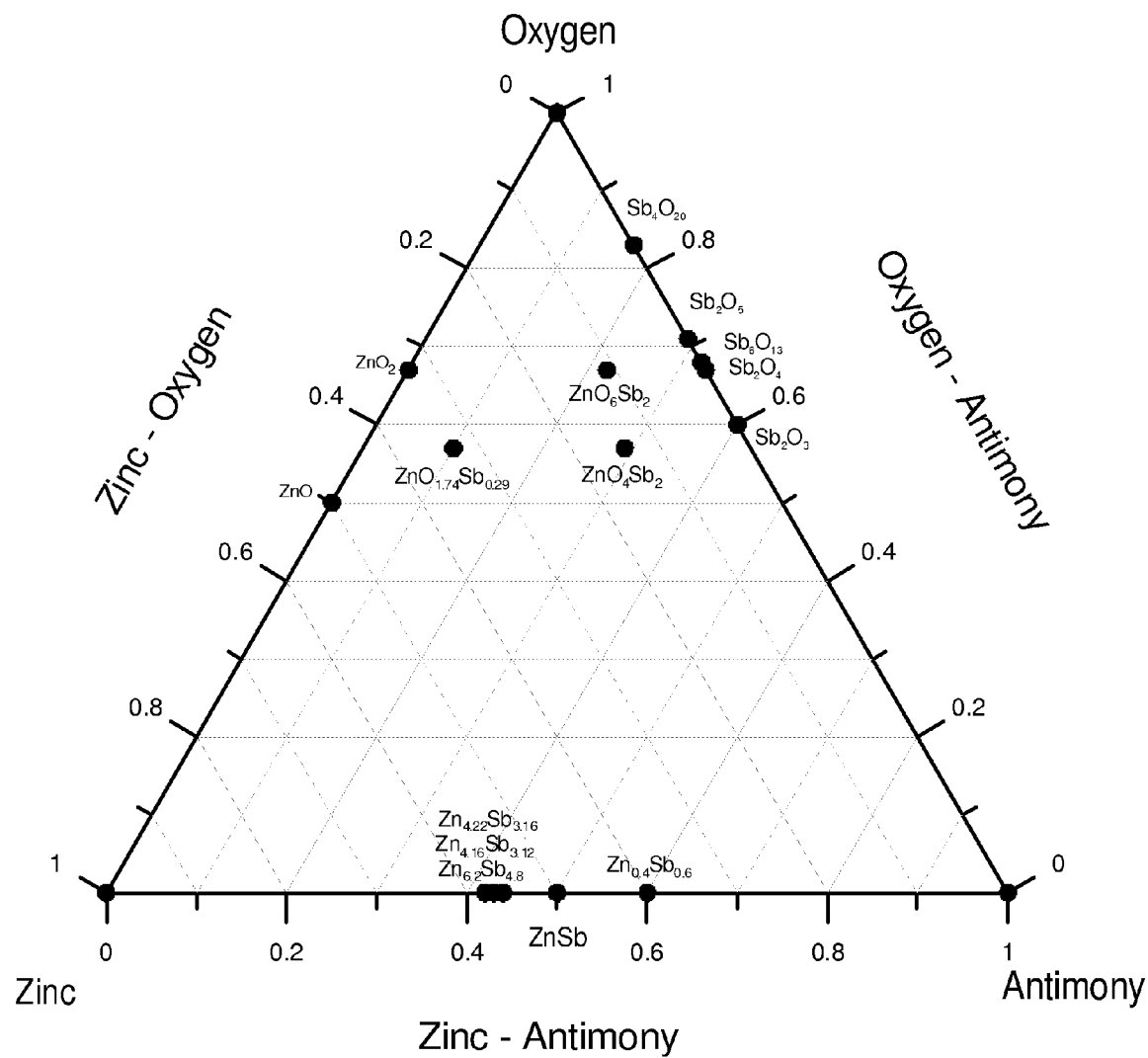
FIG. 13 is a zinc—oxygen—antimony ternary diagram.
Figure 14:
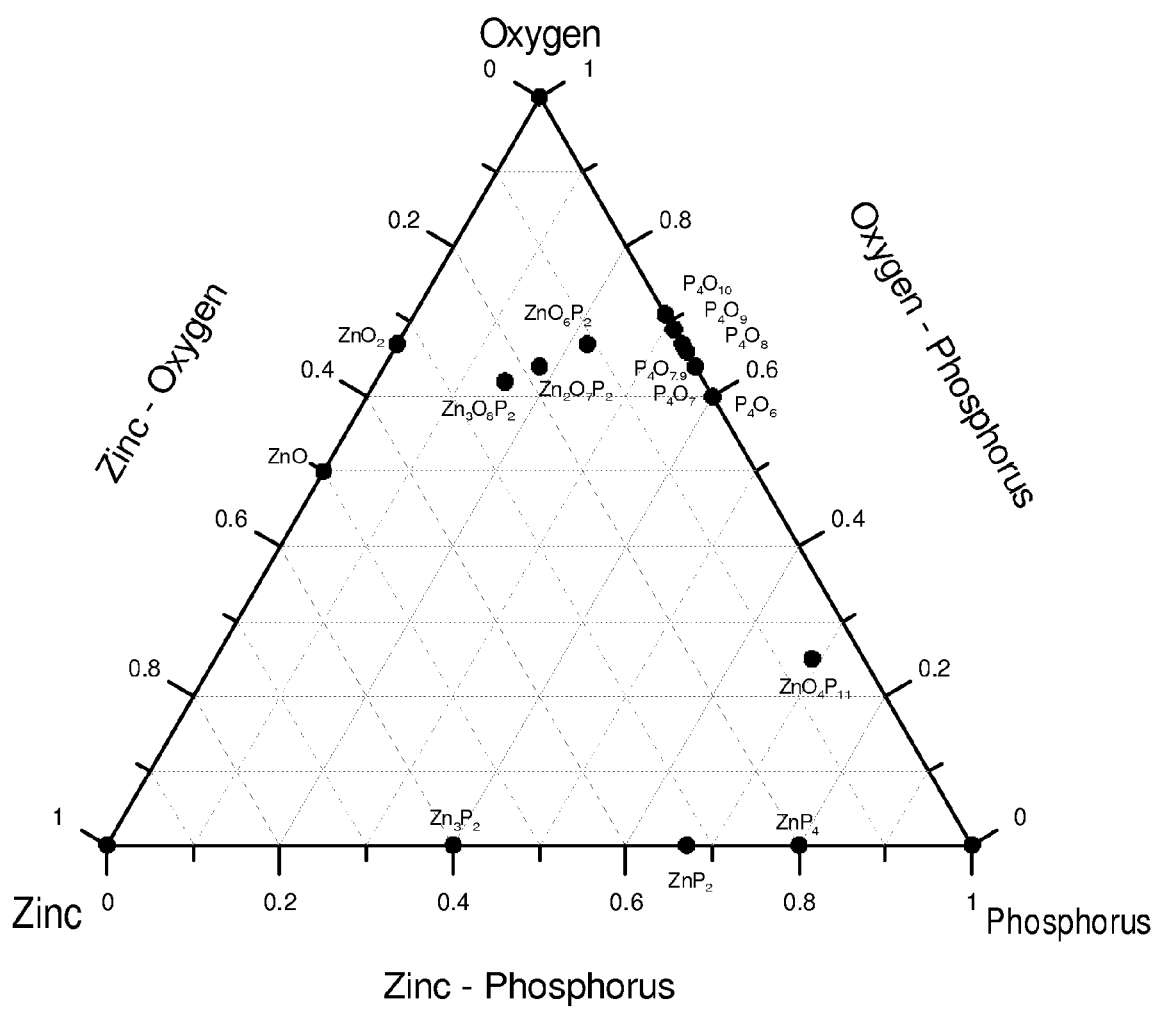
FIG. 14 is a zinc—oxygen—phosphorus ternary diagram.

Ternary diagrams for other p-type zinc oxide dopants are shown in FIGS. 13-14. It is believed that useful p-type zinc oxide semiconductor compositions will be located on these other ternary diagrams in a manner similar to the Zn—O—As diagram of FIGS. 12A-12B.

Figure 6:
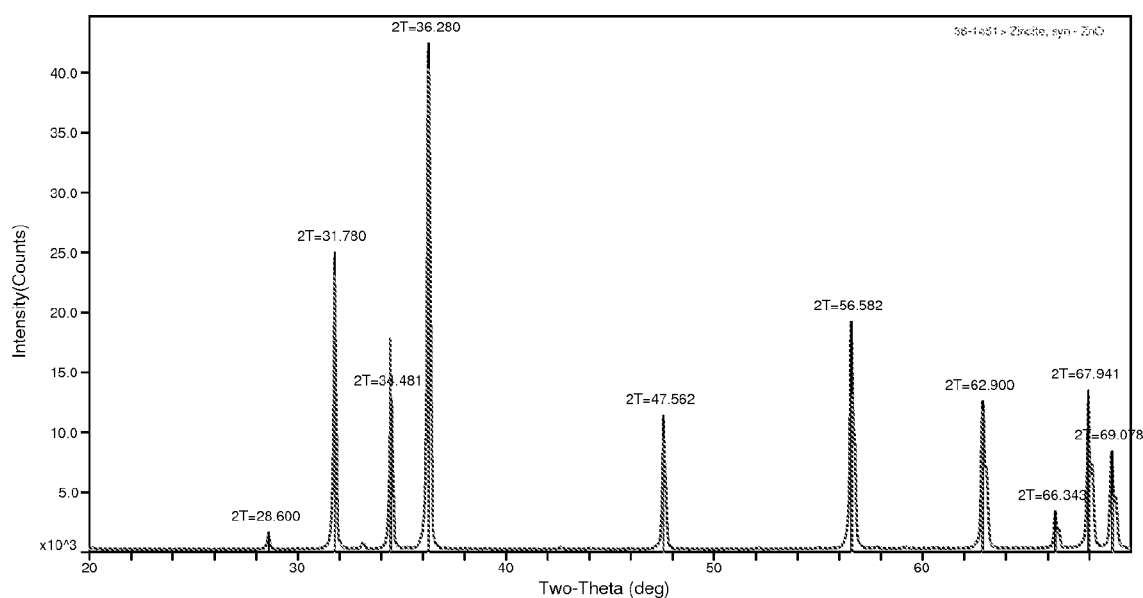
FIG. 6 is graph of the X-ray diffraction pattern generated by sputtered arsenic doped polycrystalline zinc oxide.
Figure 7:
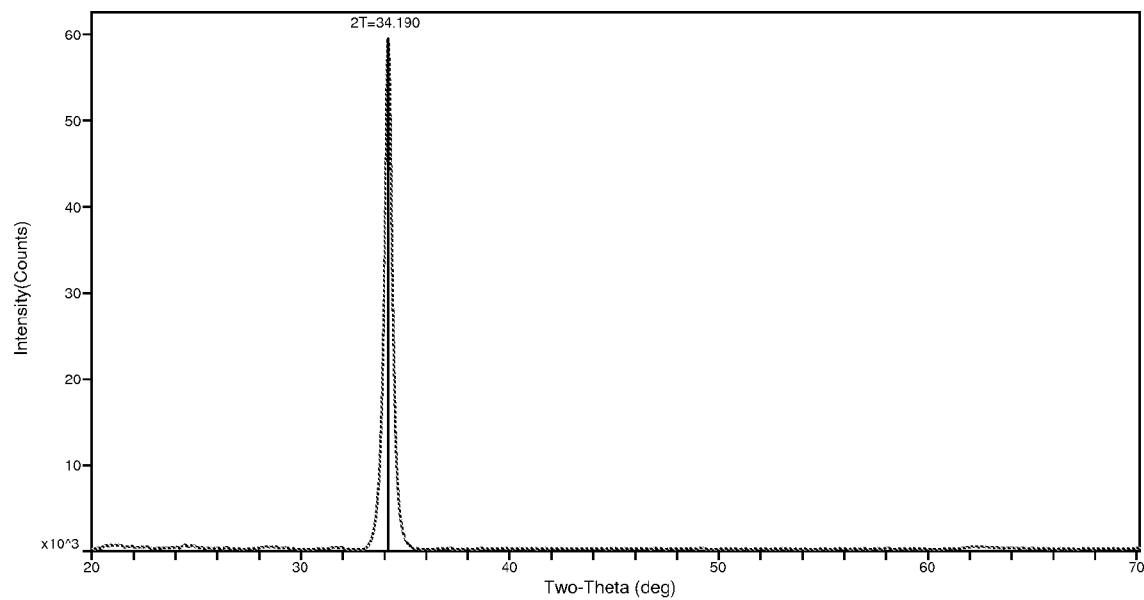
FIG. 7 is a graph of the X-ray diffraction pattern generated by a zinc oxide thin film within the scope of the present invention showing single crystal (002) plane.

A region of the arsenic doped p-type zinc oxide that was sputtered directly onto a fused silica substrate was analyzed by X-ray diffraction. A graph of the X-ray diffraction pattern is shown in FIG. 7 illustrating a single dominant peak representing the (002) plane. This indicates that single crystal p-type zinc oxide was deposited directly onto the amorphous fused silica substrate. By way of comparison, an X-ray diffraction pattern of polycrystalline zinc oxide is shown in FIG. 6.

Example 5

Sputtering of ZnO with Arsenic as a Dopant

A thin film of p-type zinc oxide was deposited onto a self supporting substrate by RF sputtering. Both fused silica and silicon wafers were used as the self supporting substrate. The sputtering target composition was Zn (0.99–0.95 moles)+

As$_2$O$_3$ (0.01–0.05 moles). The preferred target composition was about Zn (0.99 moles)+As$_2$O$_3$ (0.01 moles). The substrate temperature was between 350 and 550° C. The preferred temperature was about 400° C. The RF power was between 15 and 40 watts. The preferred power was about 30 watts. A lower power was used in this example to keep the powdered zinc metal in the target from being quickly vaporized and dispersed during the sputtering processing. The sputtering atmosphere included argon at a gas pressure of about 4 to 20 mtorr and O$_2$ at a gas pressure of about 1 to 4 mtorr. The preferred sputtering atmosphere pressures were about 10 mtorr argon and about 1 mtorr O$_2$.

The resulting transparent p-type zinc oxide layer had a resistance of about 100,000 ohms/square.

Example 6

Sputtering of ZnO with Arsenic as a Dopant

A thin film of p-type zinc oxide was deposited onto a self supporting substrate by RF sputtering. Both fused silica and silicon wafers were used as the self supporting substrate. The sputtering target composition was ZnO (0.99–0.95 moles)+As$_2$O$_3$ (0.01–0.05 moles). The preferred target composition was ZnO (0.99 moles)+As$_2$O$_3$ (0.01 moles). The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr. The preferred sputtering atmosphere pressure was about 10 mtorr argon.

The resulting transparent p-type zinc oxide layer had a resistance of about 100,000 ohms/square.

Example 7

Sputtering of ZnO with Antimony as a Dopant

A thin film of p-type zinc oxide was deposited onto a self supporting substrate by RF sputtering. Both fused silica and silicon wafers were used as the self supporting substrate. The sputtering target composition was Zn (0.99–0.95 moles)+Sb (0.01–0.05 moles). The preferred target composition was Zn (0.98 moles)+Sb (0.02 moles). The substrate temperature was between 350 and 550° C. The preferred temperature was about 400° C. The RF power was between 20 and 120 watts. The preferred power was about 90 watts. The sputtering atmosphere included argon at a gas pressure of about 4 to 20 mtorr. The preferred sputtering atmosphere pressure was about 10 mtorr argon.

The resulting transparent p-type zinc oxide layer had a resistance of about 600,000 ohms/square. Without being bound by theory, it is believed that the oxygen needed to form the zinc oxide crystal lattice was obtained from residual oxygen in the sputtering system atmosphere.

The target composition is not limited to metallic zinc and antimony. The target may comprise zinc oxide and antimony metal, zinc metal and antimony oxide, and zinc oxide and antimony oxide. The sputtering atmosphere may optionally include either hydrogen gas or oxygen gas at a gas pressure of about 0.1 to 4 mtorr in addition to the inert sputtering gas.

Example 8

Sputtering of ZnO with antimony as a dopant

A thin film of p-type zinc oxide was deposited onto a self supporting substrate by RF sputtering. Both fused silica and silicon wafers were used as the self supporting substrate. The sputtering target composition was ZnO (0.99–0.95 moles)+Sb (0.01–0.05 moles). The preferred target composition was ZnO (0.98 moles)+Sb (0.02 moles). The substrate temperature was between 350 and 550° C. The preferred temperature was about 400° C. The RF power was between 20 and 120 watts. The preferred power was about 90 watts. The sputtering atmosphere included argon at a gas pressure of about 4 to 20 mtorr. The preferred sputtering atmosphere pressure was about 10 mtorr argon.

Figure 8:
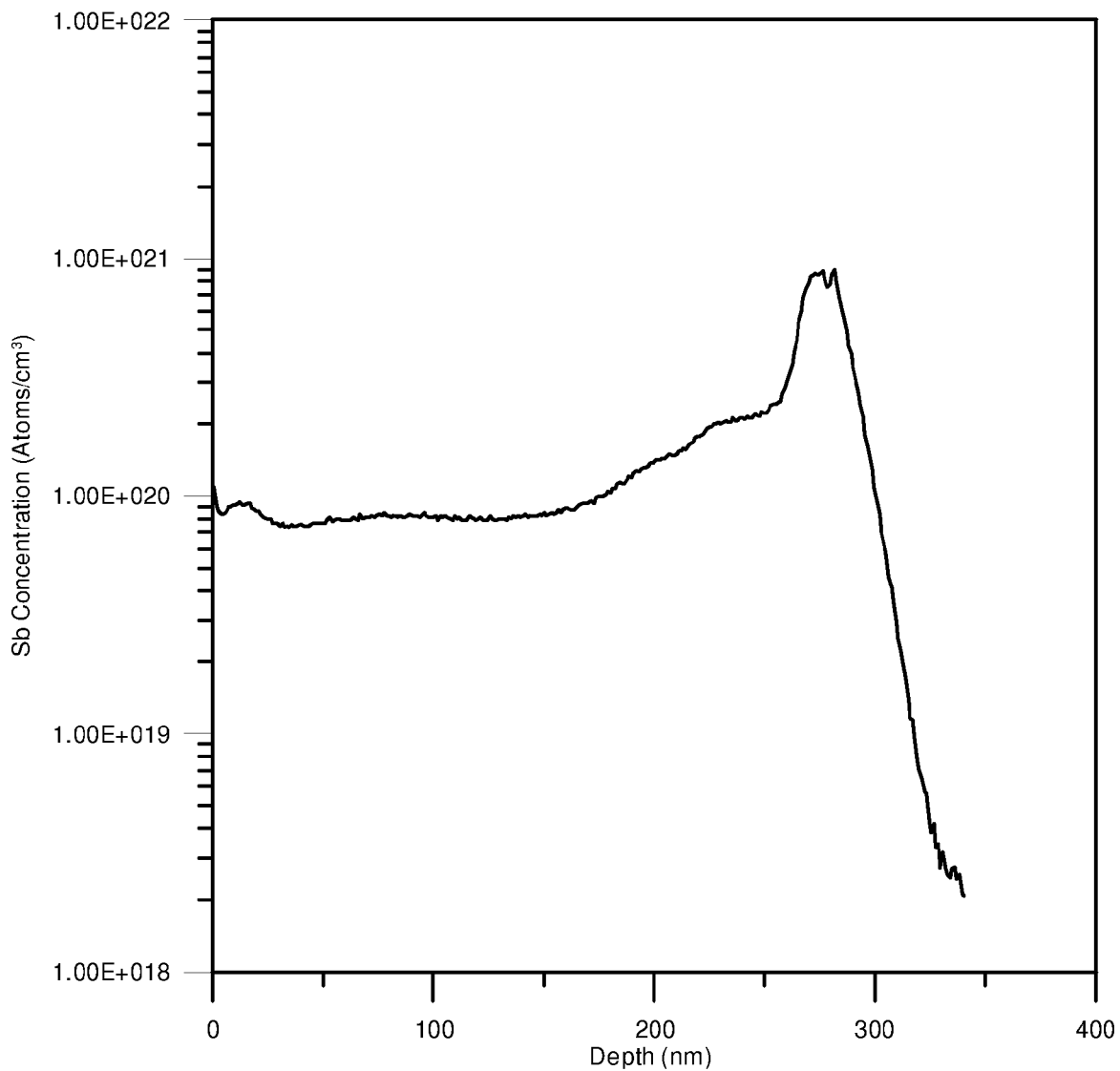
FIG. 8 is a Secondary Ion Mass Spectroscopy (SIMS) graph of an antimony doped ZnO film.

The resulting transparent p-type zinc oxide layer had a sheet resistivity of about $6.8 \times 10^{-5}$ ohm·cm and a mobility of about 169 cm$^2$/V·sec. The concentration of antimony was about $1.3 \times 10^{21}$ atoms per cm$^3$ measured by the Hall effect technique. A sample of the antimony doped p-type zinc oxide film was analyzed by Secondary Ion Mass Spectroscopy (SIMS) and measured against an antimony doped silica standard. The results were valid within a factor of 2. The results, shown graphically in FIG. 8, indicate stable and consistent arsenic doping at a concentration of about $10^{20}$ atoms/cm$^3$ to a depth of about 270 nm. The antimony concentration increased to about $10^{21}$ close to the fused silica substrate. Portions of the sample were visually transparent. Another sample of the antimony doped p-type zinc oxide layer prepared in the same manner had a sheet resistivity of about $9.4 \times 10^{-5}$ ohm·cm and a mobility of about 108 cm$^2$/V·sec. The concentration of antimony was about $6.34 \times 10^{20}$ atoms per cm$^3$ measured by the Hall effect technique.

Example 9

Sputtering of ZnO with antimony as a dopant

A thin film of p-type zinc oxide was deposited onto a self supporting substrate by RF sputtering. Both fused silica and silicon wafers were used as the self supporting substrate. The sputtering target composition was ZnO (0.99–0.95 moles)+Sb (0.01–0.05 moles). The preferred target composition was ZnO (0.98 moles)+Sb (0.02 moles). The substrate temperature was between 350 and 550° C. The preferred temperature was about 400° C. The RF power was between 20 and 120 watts. The preferred power was about 90 watts. The sputtering atmosphere included argon at a gas pressure of about 4 to 20 mtorr and oxygen gas at a pressure of about 1 mtorr. The preferred sputtering atmosphere pressure was about 10 mtorr argon and 1 mtorr oxygen.

The resulting transparent p-type zinc oxide layer had better crystallinity and mobility compared to the other antimony-doped zinc oxide thin films prepared above.

Example 10

Sputtering of ZnO with arsenic as a dopant

A thin film of p-type zinc oxide was deposited onto a self supporting substrate by RF sputtering. Both fused silica and silicon wafers were used as the self supporting substrate. A First Composition Layer comprising zinc and arsenic was deposited onto the self supporting substrate. The First Composition Layer included Zn$_3$As$_2$, ZnAs$_2$, or a mixture thereof. In one example, the zinc/arsenic layer was deposited by thermal evaporation for a period of about 2-60 seconds, with a preferred period of about 14 seconds. The temperature was about 360° C. The First Composition Layer may also be deposited by RF sputtering.

A Second Composition Layer comprising zinc oxide was deposited onto the First Composition Layer by RF sputtering.

The sputtering target composition was ZnO. The substrate temperature was between 400 and 550° C. The preferred temperature was about 450° C. The RF power was between 20 and 120 watts. The preferred power was about 100 watts. The sputtering time was between 10 and 40 minutes, and preferably about 20 minutes. The sputtering atmosphere included argon at a gas pressure of about 4 to 20 mtorr and hydrogen at a gas pressure of about 0.1 to 4 mtorr. The preferred sputtering atmosphere pressure was about 10 mtorr argon.

The resulting p-type zinc oxide layer had a resistance of about 10 to 200 ohms/square.

Example 11

Sputtering of ZnO with antimony as a dopant

A thin film of p-type zinc oxide was deposited onto a self supporting substrate by RF sputtering in accordance with the procedure of Example 10, except that the First Composition Layer comprised zinc and antimony. The resulting p-type zinc oxide layer showed high mobility.

Example 12

Sputtering of ZnO with antimony as a dopant

A thin film of p-type zinc oxide was deposited onto a self supporting substrate by RF sputtering in accordance with the procedure of Example 11, except that the First Composition Layer comprised antimony. The antimony was deposited onto the self supporting substrate by thermal evaporation. The resulting p-type zinc oxide layer showed high mobility.

Example 13

Sputtering of ZnO with arsenic as dopant

A thin film of p-type zinc oxide was deposited onto a self supporting substrate by RF sputtering. Fused silica was used as the self supporting substrate. The sputtering target composition was ZnO. The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr. In addition, a basket containing arsenic was heated to a controlled temperature sufficient to evaporate the arsenic. The basket was positioned such that the arsenic was evaporated directly onto the fused silica at the same time the zinc oxide was sputtered onto the fused silica.

The resulting transparent p-type zinc oxide layer displayed visible diffraction rings, but was very clear and transparent. It will be appreciated that this process may be adapted for use with other p-type dopants besides arsenic.

Based upon arsenic vapor pressure data, $As_4$ has a higher vapor pressure at a given temperature when compared to $As_3$, $As_2$, and As. Therefore, it is presently believed that $As_4$ is the dominant volatile arsenic species at typical operating conditions. Without being bound by theory, it is believed $As_4$ must be broken into individual arsenic atoms to be incorporated into the zinc oxide. An apparent threshold RF power of about 60 watts has been observed for the given experimental sputtering system used herein. It will be appreciated that this threshold RF power may vary depending upon the sputtering system used. Likewise, it will be appreciated that other means besides a RF field may be used to break the $As_4$ molecular bonds.

A similar phenomenon has been observed with respect to antimony vapor pressures as with arsenic discussed above. Antimony generally requires a higher temperature to achieve the same vapor pressure as arsenic. Likewise, an apparent threshold RF power of about 90 watts has been observed for the given experimental sputtering system used herein.

Example 14

Sputtering of ZnS with arsenic as dopant

A thin film of p-type zinc sulfide was deposited onto a self supporting substrate by RF sputtering. Fused silica was used as the self supporting substrate. The sputtering target composition was ZnS. The substrate temperature was between 350 and 550° C. The preferred temperature was about 400° C. The RF power was between 20 and 120 watts. The preferred power was about 60 watts. The sputtering time was about 1 to 2 minutes. The sputtering atmosphere included argon at a gas pressure of about 4 to 20 mtorr. In addition, a basket containing arsenic was heated to a controlled temperature sufficient to evaporate the arsenic. The basket was positioned such that the arsenic was evaporated directly onto the fused silica at the same time the zinc sulfide was sputtered onto the fused silica. It will be appreciated that this process may be adapted for use with other p-type dopants besides arsenic.

Example 15

Conversion of ZnS to ZnO with arsenic as a dopant

A thin film of p-type zinc sulfide was prepared in accordance with Example 10. The p-type ZnS was used as a precursor for preparing p-type ZnO. The ZnS thin film was placed in furnace containing oxygen to convert the ZnS into ZnO. The furnace temperature, atmosphere, and annealing time may be varied to control the extent of ZnS conversion. For instance, a p-type zinc oxysulfide semiconductor may be prepared by limiting the amount of oxygen in the atmosphere and preventing complete oxidation of the ZnS. In addition, the vapor pressure of the zinc, oxygen, and arsenic may be controlled to tailor the resulting dopant concentration in the semiconductor material. It will be appreciated that this process may be adapted for use with other p-type dopants besides arsenic.

Example 16

Evaporative Deposition of ZnO with arsenic as a dopant

A stable, p-type zinc oxide semiconductor material was prepared. Zinc metal, doped with 2 mole % arsenic, was deposited onto a fused silica substrate by thermal evaporation in an oxygen-rich atmosphere containing 20 mtorr argon and 10 mtorr oxygen at a temperature of about 430° C. During the deposition process, the zinc and/or arsenic was partially oxidized. The resulting As-doped ZnO thin film exhibited p-type characteristics. It had a Seebeck voltage of about positive 6 mV D.C. Increasing the oxygen pressure may result in a more complete formation of ZnO. While no further heating or annealing was performed in this example, additional heating or annealing may be desirable to control the level of zinc oxidation and/or optimize the electronic properties of the p-type semiconductor material.

Example 17

Deposition of Zinc Oxide with arsenic as dopant

A stable, p-type zinc oxide semiconductor material is prepared. Zinc arsenide is deposited onto a self-supporting substrate surface. The surface may be fused silica, silicon wafer, borosilicate glass, or similar self supporting substrate. The zinc arsenide may be $Zn_3As_2$, $ZnAs_2$, or a mixture thereof. In one example, the zinc arsenide layer is deposited by thermal evaporation for a period of about 2-60 seconds, with a preferred period of about 14 seconds. In another embodiment, the zinc arsenide layer may is deposited by sputtering. In yet another embodiment, the zinc arsenide layer is deposited by CVD or MOCVD.

The zinc arsenide layer is thermally annealed in an atmosphere containing oxygen for sufficient time period to oxidize the zinc arsenide layer and form zinc oxide doped with arsenic. At a given annealing temperature, some quantity of arsenic and zinc may evaporate from the zinc arsenide. Such evaporation may be taken into consideration in determining the starting composition of the zinc arsenide. Similarly, under these annealing conditions, it may be desirable to introduce additional amounts of gaseous arsenic, zinc, or oxygen to inhibit evaporation of these elements from the zinc oxide film and to influence the final composition of the semiconductor material.

Example 18

Spin Coating of arsenic-doped ZnO

A stable, p-type zinc oxide semiconductor material may be prepared by spin coating using arsenic as the dopant. Fused silica is used as the self supporting substrate. Zinc 2-4 pentanedionate is used as the zinc source and arsenic III ethoxide is used as the arsenic source. These compounds are dissolved in butanol which serves as a common solvent. This solution is spun onto a fused silica slide.

After a layer is spun on the substrate, it is heated to about 600° C. for about 10 minutes for pyrolysis of the organics. This procedure is repeated 5 or 6 times to get the desired film thickness. The substrate is annealed at about 700° C. for 1 to 5 hours in a nitrogen atmosphere. Control of the partial pressures of all inorganic components is desirable for the desired doped zinc oxide composition, otherwise evaporation or one or more ingredients or formation of undesired compounds may occur. The oxygen can come from the atmosphere or can come from being part of the organic precursors.

Example 19

Spin Coating of antimony-doped ZnO

A stable, p-type zinc oxide semiconductor material may be prepared by spin coating in accordance with the method of Example 18, except that antimony is used as the dopant instead of arsenic. Antimony chloride ($SbCl_3$) is used as the antimony source.

Example 20

Spin Coating of p-Type ZnS

A stable, p-type zinc sulfide semiconductor material may be prepared by spin coating in accordance with the spin coating methods described above, except that a sulfur-containing organic compound is used in combination with the zinc compound and the selected p-type dopant compound. Sulfur can be engineered into organic compounds compatible with the spin coating. An example of a possible organic sulfur compound that may be used in the spin coating is 8-(p-sulfophenyl) theophylline, which is soluble in methanol and ethanol. In such cases, one may control the oxygen and sulfur partial pressures to obtain the desired p-type ZnS. For example, if oxygen is present, then a zinc oxysulfide compound may be prepared. The partial pressures of any component in the atmosphere can be determined experimentally or they can be calculated from thermodynamic data.

Example 21

MOCVD of p-Type ZnO

A stable, p-type zinc oxide semiconductor material may be prepared by metal organic chemical vapor deposition (MOCVD) using arsenic, antimony, or other p-type dopant. A typical MOCVD process is described above.

Example 22

MOCVD of Zinc Sulfide

A stable, p-type zinc sulfide semiconductor material may be prepared by MOCVD in accordance with the method of Example 21, except that a sulfur-containing organic compound is used in combination with the zinc compound and the selected p-type dopant compound. Sulfur can be engineered into organic compounds compatible with the MOCVD. In such cases, it is important to control the oxygen and sulfur partial pressures to obtain the desired p-type ZnS material. For example, if oxygen is present, then a zinc oxysulfide compound may be prepared.

Example 23

Fabrication of Zinc Oxide p/n Junction

Figure 9:
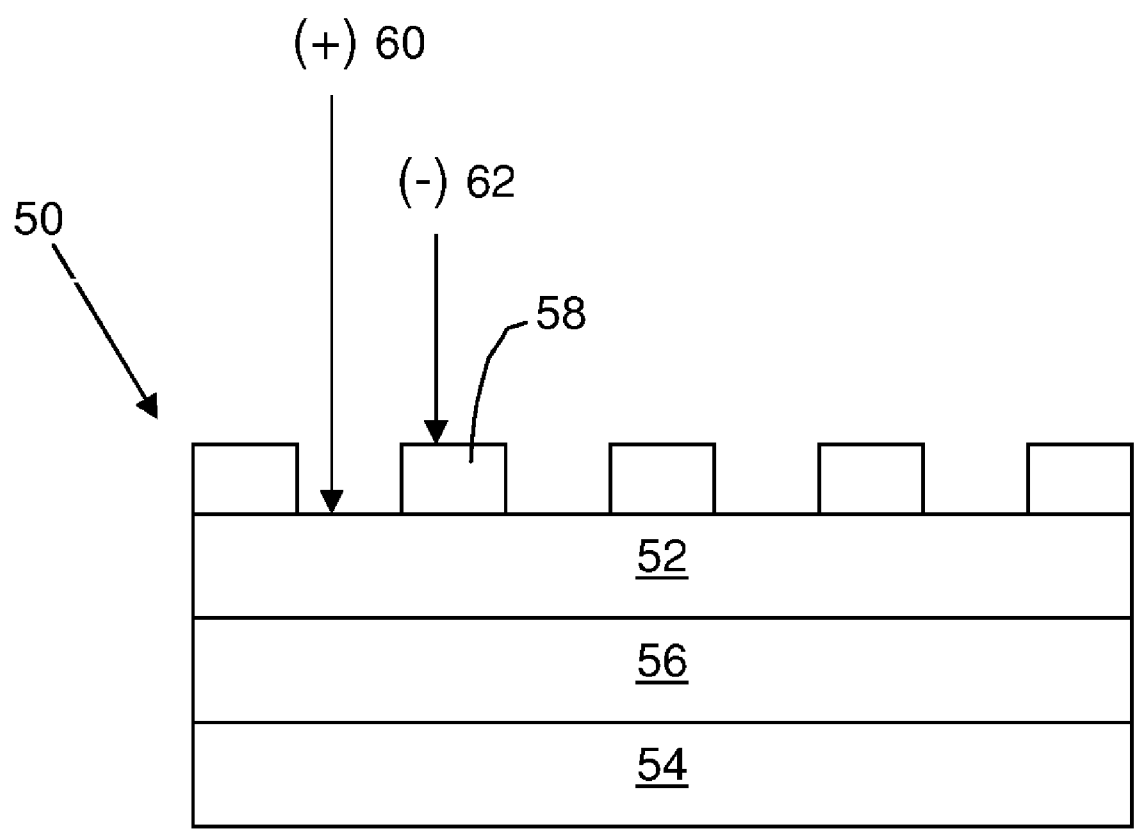
FIG. 9 is a schematic diagram of a zinc oxide p-n junction within the scope of the present invention.
Figure 10:
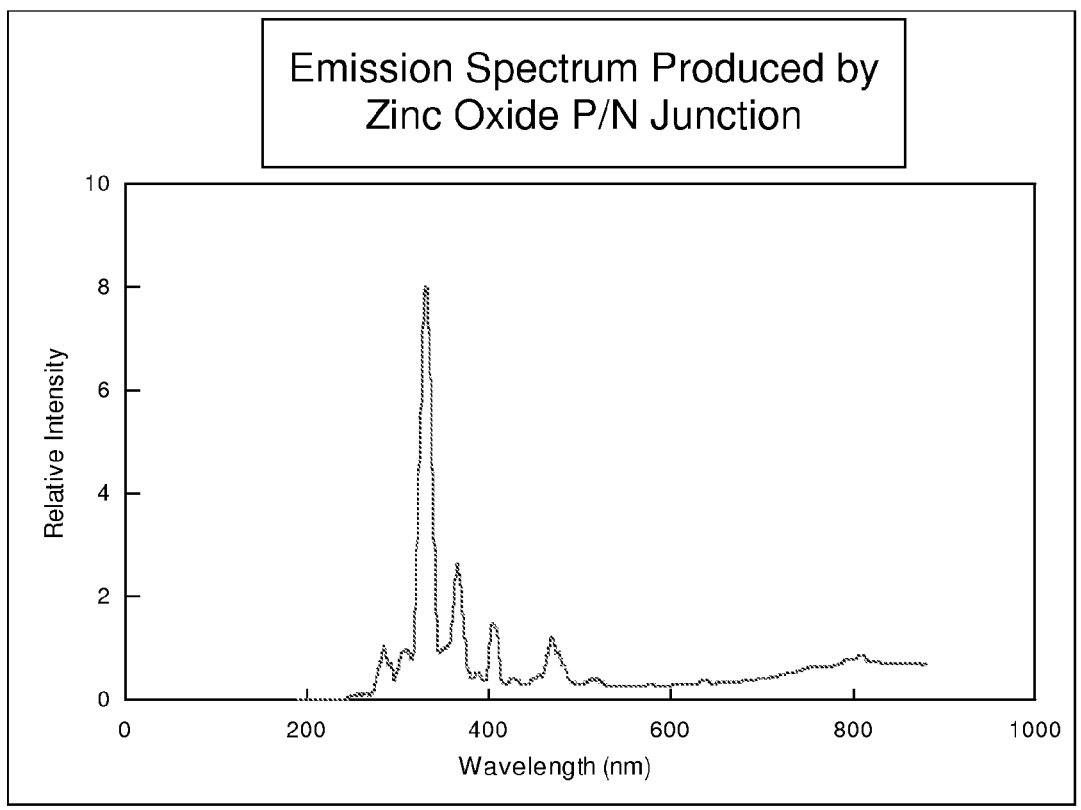
FIG. 10 shows a spectrum of light emitted from a zinc oxide p-n junction within the scope of the present invention.

A zinc oxide p/n junction 50 was fabricated as shown schematically in FIG. 9. A thin film of p-type zinc oxide 52 was deposited onto a self supporting silicon wafer substrate by RF sputtering in accordance with Example 4. In Example 4, a thin film of $Zn_3As_2$ 56 was first deposited onto the silicon wafer 54 and the p-type zinc oxide 52 was sputtered on top of the zinc arsenide 56. A thin film of n-type zinc oxide was sputtered on top of the p-type zinc oxide at about 300° C. The sputtering target included ZnO (99.925 mole %) and $Ga_2O_3$ (0.075 mole %) that had been mixed, sintered, and annealed at about 1100° C. The sputtering step occurred at a temperature of about 350° C. The sputtering atmosphere included argon at a gas pressure of about 4 to 20 mtorr. About 10% hydrogen gas may alternatively be included in the sputtering atmosphere to produce n-type ZnO. A positive electrode 60 and a negative electrode 62 were attached to the p/n junction 50 as shown in FIG. 9. A luminescent emission at room temperature was briefly observed before the p/n junction failed. Failure occurred because the electrical resistance dropped too quickly allowing excessive current to overpower the p/n junction. A graph of the measured emission spectrum is shown in FIG. 10. Because of the short duration of the light emission, it was not possible to obtain a detailed measurement of the spectrum.

Single or multiple quantum well (MQW) heterostructures may be fabricated to render the p/n junction more efficient. A single quantum well is made of two alternating semiconductor materials. One layer is a barrier layer defined by a higher band band gap than the second layer. The second layer's band gap defines the bottom of the quantum well. For example, MgO may be alloyed with ZnO to form the barrier layer, and the undoped ZnO will define the bottom of the well. This produces a more efficient device and raises the band edge. Conversely, CdO may be alloyed with ZnO to define the bottom layer of the quantum well, and the undoped ZnO defines the barrier layer. This produces a more efficient device and lowers the band edge.

An additional advantage of a quantum well is that the layers can be mechanically strained to raise or lower the band edge. Mechanical strain may exist if the two layers have slightly different crystal lattice constants. For most zinc oxide materials the band edge is around 390 nm, but some of the zinc oxide semiconductor materials fabricated in accordance with the present invention had a band edge of about 370 nm.

The number of quantum wells may vary. Good results may be obtained with just one quantum well. Typically the number of quantum wells may range from about 1 to 10, and more preferably from about 3 to 7 quantum wells. The total thickness of the quantum well alternating layers must in the vicinity of, or less than, the electron de Broglie wavelength (100 Å). These heterostructures may be fabricated through a chemical deposition process, including but not limited to those described above, such as sputtering, CVD, MOCVD, etc.

For example, one possible MQW configuration for use in connection with zinc oxide semiconductor structure may include alternating layers of ZnO (20 Å-100 Å) and $Cd_xZn_{1-x}O$ (10 Å-25 Å). The cadmium content may be varied. The amount of cadmium in the cadmium zinc oxide alloy may vary depending on the desired shifting of the band gap. In one illustrative embodiment, the cadmium content may range from about 1 to 20 mole %, and more typically about 10 mole %. The cadmium zinc oxide alloy may be replaced with a magnesium zinc oxide alloy of the general formula $Mg_xZn_{1-x}O$.

Figure 11A:
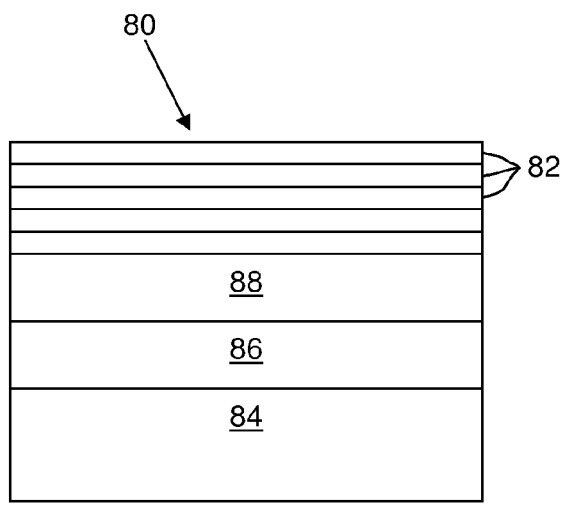
FIG. 11A is a schematic diagram of a conventional GaN solid state device fabricated on a sapphire or SiC substrate.
Figure 11B:
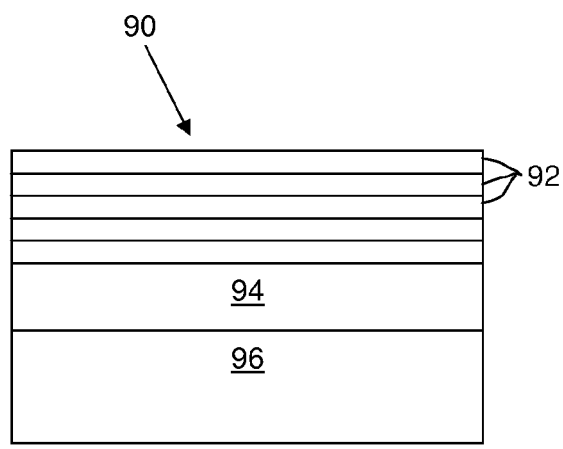
FIG. 11B is a schematic diagram of a ZnO solid state device fabricated on an alternative self-supporting substrate within the scope of the present invention.

FIG. 11A is a schematic representation of a typical state of the art GaN-based semiconductor device 80 containing MQWs 82. It will be appreciated that GaN devices are complicated to manufacture because of the expensive sapphire or SiC substrate 84 and multiple layers 86, 88 required to match the crystal lattice of GaN and the substrate. In contrast, FIG. 11B is a schematic representation of a zinc oxide based semiconductor device 90 containing MQWs 92. Because single crystal zinc oxide 94 may be deposited directly on a low-cost substrate 96, such as fused silica or a silicon wafer, the zinc oxide based semiconductor device fabricated within the scope of the present invention represents a substantial improvement over conventional GaN-based semiconductor devices.

It will be appreciated that the present invention provides persistent group II-VI semiconductor materials that include p-type dopants. The present invention further provides persistent p-type zinc oxide semiconductor materials prepared by commercially viable fabrication methods. The resulting semiconductor materials exhibit good electronic and physical properties.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

The invention claimed is:

1. A persistent p-type zinc oxide semiconductor material that exists at substantially room temperature and pressure comprising single crystal zinc oxide that is doped with a quantity of a antimony, wherein the antimony concentration is sufficient to render the zinc oxide a p-type semiconductor in a single crystal form, wherein semiconductor resistivity is less than about 0.5 ohm·cm, and wherein the carrier mobility is greater than about 100cm$^2$/V·s.

2. A persistent p-type zinc oxide semiconductor material according to claim 1, wherein the resistivity is less than about 0.1 ohm·cm.

3. A persistent p-type zinc oxide semiconductor material according to claim 1, wherein the resistivity is less than about 0.01ohm·cm.

4. A persistent p-type zinc oxide semiconductor material according to claim 1, wherein the resistivity is less than about 0.001 ohm·cm.

5. A persistent p-type zinc oxide semiconductor material according to claim 1, wherein the antimony concentration is in the range from about $10^{16}$ to about $10^{22}$ atoms·cm$^{-3}$.

6. A persistent p-type zinc oxide semiconductor material according to claim 1, wherein the antimony concentration is greater than about $10^{16}$ atoms·cm$^{-3}$.

7. A persistent p-type zinc oxide semiconductor material according to claim 1, wherein the antimony concentration is in the range from about $10^{17}$ to $10^{19}$ atoms·cm$^{-3}$.

8. A persistent p-type zinc oxide semiconductor material according to claim 1, wherein the zinc oxide is deposited as a thin film on an amorphous self supporting substrate surface.

9. A persistent p-type zinc oxide semiconductor material according to claim 8, wherein the zinc oxide is deposited as a thin film on a fused silica self supporting substrate.

10. A persistent p-type zinc oxide semiconductor material according to claim 8, wherein the zinc oxide is deposited as a thin film on a silicon wafer self supporting substrate.

11. A persistent p-type zinc oxide semiconductor material according to claim 1, wherein the zinc oxide further comprises cadmium oxide.

12. A persistent p-type zinc oxide semiconductor material according to claim 1, wherein the zinc oxide further comprises magnesium oxide.

13. A persistent p-type zinc oxide semiconductor material according to claim 1, wherein the zinc oxide is a non-stoichiometric zinc oxide compound.

14. A persistent p-type zinc oxide semiconductor material according to claim 1, wherein the zinc oxide is fabricated at a substrate temperature between about 350°C. and 550°C.

15. A persistent p-type zinc oxide semiconductor material that exists at substantially room temperature and pressure comprising single crystal zinc oxide that is doped with a quantity of a antimony, wherein the antimony concentration is greater than about $10^{16}$ atoms·cm$^{-3}$ and sufficient to render the zinc oxide a p-type semiconductor in a single crystal form, wherein semiconductor resistivity is less than about 0.01ohm·cm, and wherein the carrier mobility is greater than about 100cm$^2$/V·s, wherein the zinc oxide is fabricated at a substrate temperature between about 350°C. and 550°C.

16. A persistent p-type zinc oxide semiconductor material according to claim 15, wherein the zinc oxide is deposited as a thin film on an amorphous self supporting substrate surface.

17. A persistent p-type zinc oxide semiconductor material according to claim 16, wherein the zinc oxide is deposited as a thin film on a fused silica self supporting substrate.

18. A persistent p-type zinc oxide semiconductor material according to claim 16, wherein the zinc oxide is deposited as a thin film on a silicon wafer self supporting substrate.

19. A persistent p-type zinc oxide semiconductor material according to claim 15, wherein the zinc oxide further comprises cadmium oxide.

20. A persistent p-type zinc oxide semiconductor material according to claim 15, wherein the zinc oxide further comprises magnesium oxide.

* * * * *

UNITED STATES PATENT AND TRADEMARK OFFICE
CERTIFICATE OF CORRECTION

PATENT NO.        : 7,473,925 B2                                Page 1 of 1
APPLICATION NO.   : 11/620325
DATED             : January 6, 2009
INVENTOR(S)       : Robert H. Burgener, II et al.

It is certified that error appears in the above-identified patent and that said Letters Patent is hereby corrected as shown below:

Column 18, line 3, "ivention" should be changed to --invention--.

Signed and Sealed this

Twentieth Day of July, 2010

David J. Kappos
*Director of the United States Patent and Trademark Office*